(12) United States Patent
Park et al.

(10) Patent No.: US 10,818,734 B2
(45) Date of Patent: Oct. 27, 2020

(54) DISPLAY DEVICE

(71) Applicant: Samsung Display Co., Ltd., Yongin-si (KR)

(72) Inventors: Mi-ae Park, Seongnam-si (KR); Jinhwan Kim, Seoul (KR); Byeong-jin Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 82 days.

(21) Appl. No.: 16/055,278

(22) Filed: Aug. 6, 2018

(65) Prior Publication Data

US 2019/0058014 A1 Feb. 21, 2019

(30) Foreign Application Priority Data

Aug. 17, 2017 (KR) .................. 10-2017-0104279

(51) Int. Cl.
| | |
|---|---|
| *G06F 3/041* | (2006.01) |
| *H01L 27/32* | (2006.01) |
| *G06F 3/0354* | (2013.01) |
| *G06F 3/044* | (2006.01) |
| *G06F 1/16* | (2006.01) |
| *H01L 51/52* | (2006.01) |

(52) U.S. Cl.
CPC .......... *H01L 27/323* (2013.01); *G06F 1/1643* (2013.01); *G06F 1/1652* (2013.01); *G06F 3/03547* (2013.01); *G06F 3/044* (2013.01); *G06F 3/0416* (2013.01); *H01L 27/3246* (2013.01); *H01L 27/3276* (2013.01); *H01L 51/5253* (2013.01); *H01L 51/5281* (2013.01); *G06F 3/0412* (2013.01); *G06F 2203/04112* (2013.01)

(58) Field of Classification Search
None
See application file for complete search history.

(56) References Cited

U.S. PATENT DOCUMENTS

| | | | |
|---|---|---|---|
| 10,521,039 B2 * | 12/2019 | Ma | H01L 51/5253 |
| 2004/0017363 A1 * | 1/2004 | Nakanishi | G06F 3/041 345/173 |
| 2008/0252617 A1 * | 10/2008 | Nakamura | G06F 3/042 345/175 |
| 2015/0109247 A1 | 4/2015 | Chen et al. | |
| 2015/0212538 A1 | 7/2015 | Lee et al. | |
| 2016/0209965 A1 | 7/2016 | Kim et al. | |
| 2019/0250750 A1 * | 8/2019 | Ma | H01L 27/323 |

FOREIGN PATENT DOCUMENTS

| | | |
|---|---|---|
| KR | 10-2014-0011154 | 1/2014 |
| KR | 10-2014-0097857 | 8/2014 |
| KR | 10-2015-0088489 | 8/2015 |
| KR | 10-2016-0140239 | 12/2016 |

* cited by examiner

*Primary Examiner* — Carl Adams
(74) *Attorney, Agent, or Firm* — H.C. Park & Associates, PLC

(57) ABSTRACT

A display device includes an input sensing unit having a plurality of sensing electrodes, a plurality of signal lines each of which is connected to a corresponding one of the plurality of sensing electrodes, and a plurality of sensing pads each of which each is connected to a corresponding one of the plurality of signal lines. The sensing pads are arranged in a non-linear configuration, such as a plurality of rows when viewed in a plan view.

40 Claims, 16 Drawing Sheets

DISPLAY DEVICE

CROSS-REFERENCE TO RELATED APPLICATION

This application claims priority from and the benefit of Korean Patent Application No. 10-2017-0104279, filed on Aug. 17, 2017, which is hereby incorporated by reference for all purposes as if fully set forth herein.

BACKGROUND

Field

Exemplary embodiments of the invention relate generally to a display device including an input sensing unit, and, more specifically, to a display device in which the width of the pad connection part of the input sensing unit is smaller that the width of the pad connection part of the display.

Discussion of the Background

Electronic devices such as smart phones, digital cameras, notebook computers, navigation systems, and smart televisions have been developed. These electronic devices include display devices to provide information.

The display devices may include input sensing units that are used as input devices and are disposed on front surfaces of display panels. The input sensing units may be categorized as any one of add-on type input sensing units, cover glass-integrated type input sensing units, and display-integrated type input sensing units. The display-integrated type input sensing units may include in-cell type input sensing units and on-cell type input sensing units. Input sensing units add complexity to the manufacture of display device and typically have a separate printed circuit board that is heated or pressed during manufacture to attach it to the display panel.

The above information disclosed in this Background section is only for understanding of the background of the inventive concepts, and, therefore, it may contain information that does not constitute prior art.

SUMMARY

Applicant discovered that attaching printed circuit boards (PCB's) for the input sensing unit and the display to the display panel (e.g., heat attachment) can result in manufacturing problems and defects when the PCB's are disposed in close overlapping positions. Display devices constructed according to the principles and exemplary embodiments of the invention are capable of reducing a width of a pad connection part of an input sensing unit, thereby minimizing the overlap and defects due to the attachment processes.

Also, display devices constructed according to the principles and exemplary implementations of the invention are capable of reducing a width of a COF (Chip On Flexible Printed Circuit) to correspond to the reduced width of the pad part.

Additional features of the inventive concepts will be set forth in the description which follows, and in part will be apparent from the description, or may be learned by practice of the inventive concepts.

According to one aspect of the invention, a display device includes a display panel having a display area including a plurality of light emitting elements; and a non-display area having a plurality of display pads electrically connected to the plurality of light emitting elements; a first printed circuit board disposed on the non-display area of the display panel and electrically connected to the plurality of display pads; a first adhesive member disposed on the display area of the display panel and a portion of the first printed circuit board; a second adhesive member disposed on the anti-reflection member; a second printed circuit board overlapping with the non-display area; an anisotropic conductive film disposed on the second printed circuit board; a plurality of sensing electrodes overlapping with the display area and disposed on the second adhesive member; a plurality of signal lines, each of which is connected to a corresponding one of the plurality of sensing electrodes; and a plurality of sensing pads disposed on the anisotropic conductive film and electrically connected to the second printed circuit board by the anisotropic conductive film, wherein the sensing pads are arranged in a non-linear configuration.

The sensing pads may be arranged in plurality of rows.

The display device may further include a base film disposed on the plurality of sensing electrodes, the plurality of signal lines, and the plurality of sensing pads; a third adhesive member disposed on the base film; and a window disposed on the third adhesive member.

The plurality of sensing pads may include a plurality of first sensing pads arranged in a first row of the plurality of rows; a plurality of second sensing pads arranged in a second row of the plurality of rows; and a plurality of third sensing pads arranged in a third row of the plurality of rows.

N signal lines of the plurality of signal lines may be disposed between adjacent two of the plurality of first sensing pads, where 'n' is a natural number equal to or greater than 2, and m signal line(s) of the plurality of signal lines may be disposed between adjacent two of the plurality of second sensing pads, where 'm' is a natural number less than the 'n'. The 'n' may be 2 and the 'm' may be 1.

No signal lines may be disposed between any adjacent two of the plurality of third sensing pads.

The first sensing pads may be arranged in a first direction, the second sensing pads are arranged in the first direction, and the third sensing pads are arranged in the first direction. The plurality of first sensing pads may include a plurality of first left sensing pads overlapping with the second sensing pads and the third sensing pads in a second direction perpendicular to the first direction; a plurality of first central sensing pads overlapping with only the second sensing pads of the plurality of sensing pads in the second direction; and a plurality of first right sensing pads not overlapping with the plurality of second sensing pads and the plurality of third sensing pads in the second direction.

The plurality of second sensing pads may include a plurality of second left sensing pads overlapping with only the third sensing pads of the plurality of sensing pads in the second direction; a plurality of second central sensing pads overlapping with the first sensing pads and the third sensing pads in the second direction; and a plurality of second right sensing pads overlapping with only the first sensing pads of the plurality of sensing pads in the second direction.

The plurality of third sensing pads may include a plurality of third left sensing pads not overlapping with the plurality of first sensing pads and the plurality of second sensing pads in the second direction; a plurality of third central sensing pads overlapping with only the second sensing pads of the plurality of sensing pads in the second direction; and a plurality of third right sensing pads overlapping with the first sensing pads and the second sensing pads in the second direction.

Some of the sensing pads may be arranged in two overlapping rows, and other of the sensing pads may be arranged in three overlapping rows. Two of the plurality of signal lines may be disposed between and adjacent two of the plurality of first sensing pads. Two of the plurality of signal lines may be disposed between two of the plurality of second sensing pads, which are adjacent to each other in the two overlapping rows. One of the plurality of signal lines may be disposed between two of the plurality of second sensing pads, which are adjacent to each other in the three overlapping rows.

The plurality of sensing pads may be disposed in a sensing pad area having a first length that is shorter than a second length of a display pad area in which the plurality of display pads is disposed.

The first length may be equal to or greater than 35% and less than 45% of a third length of the display panel, and the second length may be equal to or greater than 45% and less than 55% of the third length. The first length may be equal to or greater than 75% and equal to or less than 85% of the second length.

The display device may further include a left sensing pad area in which left sensing pads of the plurality of sensing pads are disposed, and a right sensing pad area in which right sensing pads of the plurality of sensing pads are disposed; a display pad area in which the plurality of display pads is disposed. A right portion of the left sensing pad area may overlap with a left portion of the display pad area in a plan view, and a left portion of the right sensing pad area overlaps with a right portion of the display pad area in a plan view.

The plurality of sensing pads may not overlap with the plurality of display pads when viewed in a plan view.

The display device may further include an anti-reflection member overlapping with the display area and disposed on the first adhesive member. A portion of the plurality of sensing pads may overlap with the anti-reflection member when viewed in a plan view.

The plurality of sensing electrodes may include a transparent conductive material.

Each of the plurality of sensing electrodes may have a mesh shape.

The anti-reflection member may be a polarizer.

According to another aspect of the invention, a display device includes a display panel comprising a plurality of light emitting elements; and an input sensing unit disposed on the display panel and sensing a contact of an external object. The input sensing unit may include a base film; a plurality of sensing electrodes disposed under the base film; a plurality of signal lines respectively connected to the plurality of sensing electrodes and transmitting signals corresponding to changes in capacitance of the plurality of sensing electrodes; and a plurality of sensing pads respectively connected to the plurality of signal lines and arranged in a non-linear configuration.

The display device may further include an anti-reflection member disposed between the display panel and the input sensing unit. The anti-reflection member may be a polarizer.

The display device may further include a first adhesive member disposed between the display panel and the anti-reflection member; and a second adhesive member disposed between the input sensing unit and the anti-reflection member.

At least one of the plurality of sensing electrodes may be capacitively coupled to the external object to generate the change in capacitance.

Each of the plurality of sensing electrodes may be insulated from others of the plurality of sensing electrodes.

The plurality of sensing pads may include a plurality of first sensing pads arranged in a first row of the plurality of rows; a plurality of second sensing pads arranged in a second row of the plurality of rows; and a plurality of third sensing pads arranged in a third row of the plurality of rows.

N signal lines of the plurality of signal lines may be disposed between adjacent two of the plurality of first sensing pads, where 'n' is a natural number equal to or greater than 2 and m signal line(s) of the plurality of signal lines may be disposed between adjacent two of the plurality of second sensing pads, where 'm' is a natural number less than the 'n'. The 'n' may be 2 and the 'm' may be 1.

No signal lines may be disposed between any adjacent two of the plurality of third sensing pads.

The first sensing pads may be arranged in a first direction, the second sensing pads are arranged in the first direction, and the third sensing pads are arranged in the first direction. The plurality of first sensing pads may include a plurality of first left sensing pads overlapping with the second sensing pads and the third sensing pads in a second direction perpendicular to the first direction; a plurality of first central sensing pads overlapping with only the second sensing pads of the plurality of sensing pads in the second direction; and a plurality of first right sensing pads not overlapping with the plurality of second sensing pads and the plurality of third sensing pads in the second direction.

The plurality of second sensing pads may include a plurality of second left sensing pads overlapping with only the third sensing pads of the plurality of sensing pads in the second direction; a plurality of second central sensing pads overlapping with the first sensing pads and the third sensing pads in the second direction; and a plurality of second right sensing pads overlapping with only the first sensing pads of the plurality of sensing pads in the second direction.

The plurality of third sensing pads may include a plurality of third left sensing pads not overlapping with the plurality of first sensing pads and the plurality of second sensing pads in the second direction; a plurality of third central sensing pads overlapping with only the second sensing pads of the plurality of sensing pads in the second direction; and a plurality of third right sensing pads overlapping with the first sensing pads and the second sensing pads in the second direction.

The plurality of sensing pads may be disposed in a sensing pad area having a first length that is shorter than a second length of a display pad area in which the plurality of display pads is disposed.

The first length may be equal to or greater than 35% and less than 45% of a third length of the display panel, and the second length may be equal to or greater than 45% and less than 55% of the third length. The first length may range from 75% to 85% of the second length.

A first distance between the first sensing pads may be greater than a second distance between the second sensing pads, and the second distance between the second sensing pads may be greater than a third distance between the third sensing pads.

A distance between the third sensing pads adjacent to each other in the two overlapping rows may be different from a distance between the third sensing pads adjacent to each other in the three overlapping rows.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
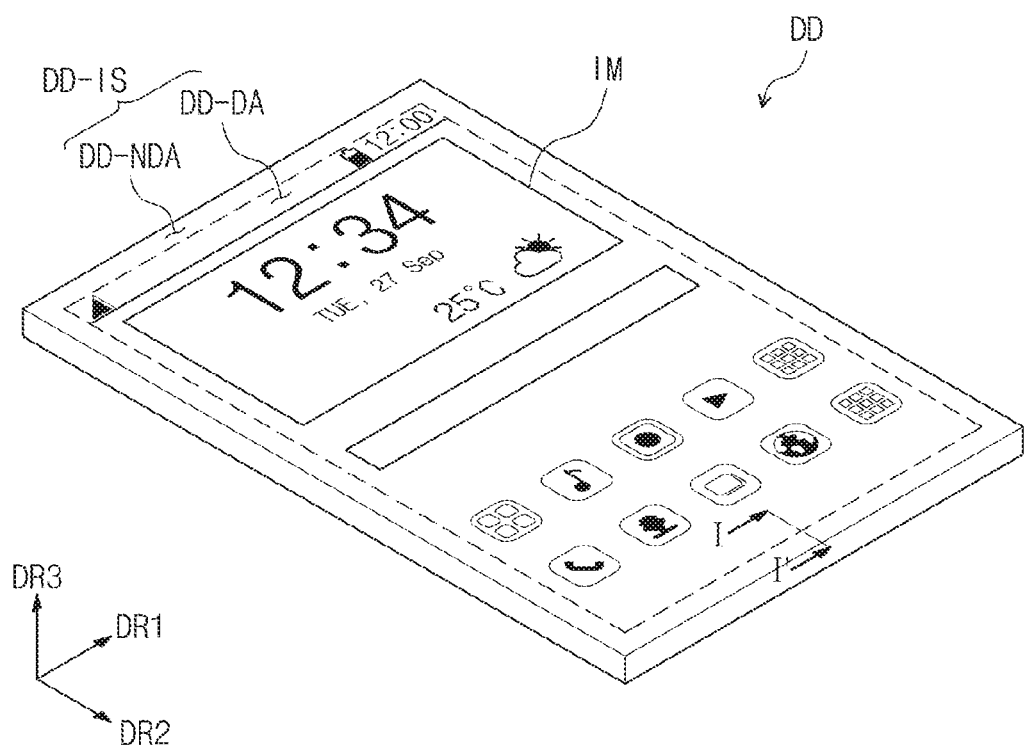
FIG. 1 is a perspective view of an exemplary embodiment of a display device constructed according to the principles of the invention in an expanded, generally flat configuration.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an exemplary embodiment of a display device DD constructed according to the principles of the invention in an expanded, generally flat configuration.

Display device DD has a display surface DD-IS, on which an image IM is displayed, which is generally parallel to a plane defined by a first directional axis DR1 and a second directional axis DR2. A normal direction of the display surface DD-IS (i.e., a thickness direction of the display device DD) is generally parallel to a third directional axis DR3. A front surface (or a top surface) and a back surface (or a bottom surface) of each of members are defined by the third directional axis DR3. However, directions indicated by the first to third directional axes DR1, DR2, and DR3 may be relative concepts and may be changed into other directions. Hereinafter, first to third directions are the directions indicated by the first to third directional axes DR1, DR2, and DR3, respectively, and are indicated by the same reference designators as the first to third directional axes DR1, DR2, and DR3.

The display device DD according to the invention may be used in large-sized electronic devices (e.g., televisions and monitors) and small and middle-sized electronic devices (e.g., smart phones, tablets, car navigation units, game consoles, and smart watches). In the illustrated embodiment, the display device DD used in a smart phone is shown illustrated as an example.

Referring to FIG. 1, the display surface DD-IS includes a display area DD-DA, in which the image IM is displayed, and a non-display area DD-NDA adjacent to the display area DD-DA. An image is not displayed in the non-display area DD-NDA. In FIG. 1, application icons are illustrated as an example of the image IM. For example, the display area DD-DA may have a quadrilateral shape (e.g., a rectangular shape). The non-display area DD-NDA may surround the display area DD-DA in a plan view. However, embodiments of the invention are not limited thereto. The shapes of the display area DD-DA and the non-display area DD-NDA may be relatively or variously designed.

Figure 2A:
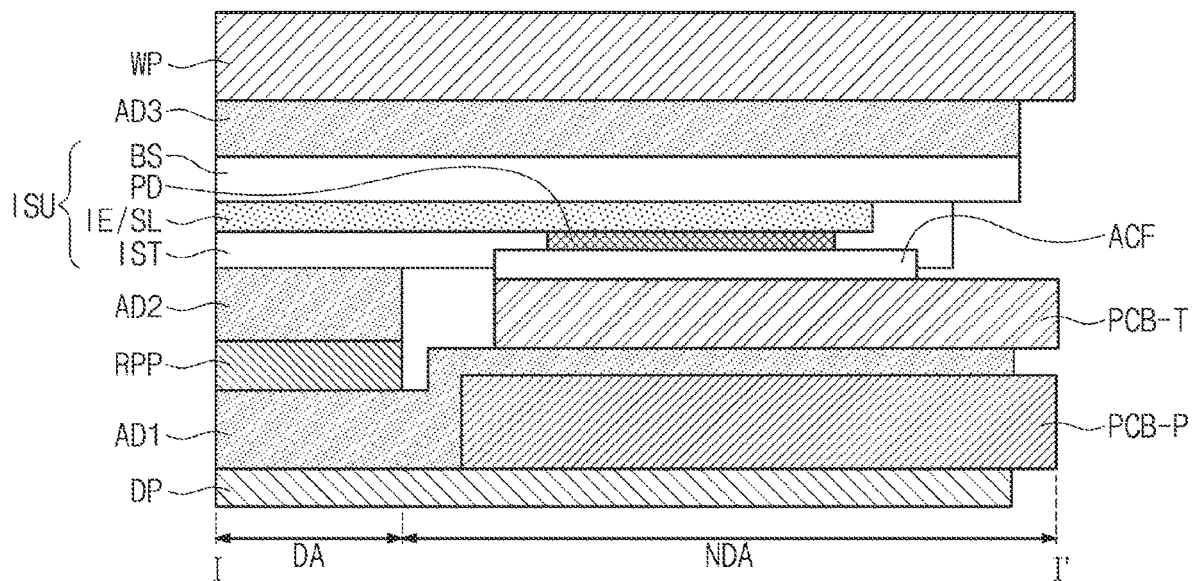
FIGS. 2A and 2B are cross-sectional views taken along a line I-I' of FIG. 1.
Figure 2B:
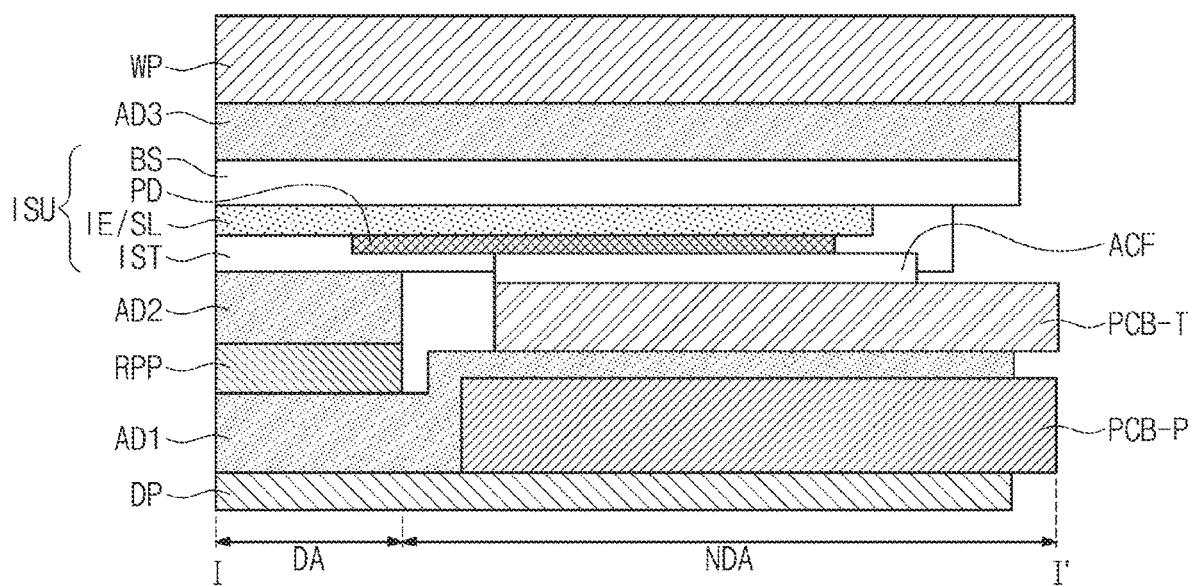

FIGS. 2A and 2B are cross-sectional views taken along a line I-I' of FIG. 1.

Referring to FIG. 2A, the display device DD may include a display panel DP, a first printed circuit board PCB-P, a second printed circuit board PCB-T, an anti-reflection member RPP, an input sensing unit ISU, a window WP, first to third adhesive members AD1, AD2 and AD3, and an anisotropic conductive film ACF. Each of the first to third adhesive members AD1, AD2 and AD3 may be a pressure sensitive adhesive (PSA) or an optically clear adhesive (OCA). The pressure sensitive adhesive (PSA) is an adhesive of which an adhesive material works when pressure is applied to adhere the adhesive to an adhesive surface.

The display panel DP may generate an image IM (see FIG. 1). A display area DA and a non-display area NDA may be defined in the display panel DP. The display area DA may include a plurality of light emitting elements LM (see FIG. 4). The non-display area NDA may be a peripheral area of the display area DA and may include signal lines and electrical parts for providing electrical signals to the plurality of light emitting elements LM. For example, the non-display area NDA may include a plurality of display pads PD-DP (see FIG. 3) electrically connected to the plurality of light emitting elements LM.

The first printed circuit board PCB-P may be disposed on the non-display area NDA of the display panel DP and may be electrically connected to the display pads PD-DP. The first printed circuit board PCB-P may provide electrical signals to the light emitting elements LM through the display pads PD-DP.

The first adhesive member AD1 may be disposed on the display area DA of the display panel DP and a portion of the first printed circuit board PCB-P. The display panel DP and the anti-reflection member RPP may be adhered to each other by the first adhesive member AD1. In addition, the first printed circuit board PCB-P and the second printed circuit board PCB-T may be adhered to each other by the first adhesive member AD1.

The anti-reflection member RPP is disposed on the first adhesive member AD1 and overlaps with the display area DA of the display panel DP. The anti-reflection member RPP may absorb, destructively interfere with or polarize external light inputted from the outside to reduce a reflectance of the external light.

In some embodiments of the invention, the anti-reflection member RPP may include a color filter, a stack structure of a conductive layer/a dielectric layer/a conductive layer, a polarizer, or an optical member.

The second printed circuit board PCB-T is disposed on the first adhesive member AD1 and overlaps with the non-display area NDA. The second printed circuit board PCB-T may provide electrical signals to the input sensing unit ISU.

The second adhesive member AD2 may be disposed on the anti-reflection member RPP. The anti-reflection member RPP and the input sensing unit ISU may be adhered to each other by the second adhesive member AD2.

The input sensing unit ISU is disposed on the second adhesive member AD2 and the second printed circuit board PCB-T. The input sensing unit ISU may include a base film BS, a plurality of sensing electrodes IE, a plurality of signal lines SL, an insulating layer IST, and a plurality of sensing pads PD.

The sensing electrodes IE and the signal lines SL may be disposed on a surface of the base film BS. The sensing electrodes IE may overlap with the display area DA.

The sensing electrodes IE and the signal lines SL are covered by the insulating layer IST. The insulating layer IST may be in contact with the second adhesive member AD2.

The sensing electrodes IE may include a transparent conductive oxide such as indium tin oxide (ITO), indium zinc oxide (IZO), zinc oxide (ZnO), or indium tin zinc oxide (ITZO). Alternatively, the sensing electrodes IE may include a conductive polymer (e.g., PEDOT), a metal nanowire, and/or graphene.

The signal lines SL are connected to the sensing pads PD, and the sensing pads PD may be electrically connected to the second printed circuit board PCB-T through the anisotropic conductive film ACF.

The input sensing unit ISU may be manufactured by processes different from processes of manufacturing the display panel DP and then may be adhered to the display panel DP.

However, embodiments of the invention are not limited thereto. In another embodiment of the invention, the input sensing unit ISU may be disposed directly on a surface of the display panel DP. In other words, the input sensing unit ISU may be integrally manufactured with the display panel DP by continuous processes. In this case, the input sensing unit ISU may be coupled to the display panel DP without the second adhesive member AD2. In this case, the input sensing unit ISU may not include the base film.

The third adhesive member AD3 is disposed on the base film BS. The input sensing unit ISU and the window WP may be adhered to each other by the third adhesive member AD3.

The window WP may be disposed on the third adhesive member AD3.

The window WP may protect the input sensing unit ISU and the display panel DP from an external impact and may provide an input sensing surface to a user. The input sensing surface may include a touch sensing surface or a fingerprint recognizing surface. The display surface DD-IS illustrated in FIG. 1 may be the touch sensing surface for sensing a touch of a user. Alternatively/in addition, the display surface DD-IS may be the fingerprint recognizing surface for recognizing a fingerprint of a user.

The window WP may include glass. However, embodiments of the invention are not limited thereto. In certain embodiments, the window WP may include a transparent material capable of transmitting light.

Referring to FIG. 2B, one or some of the sensing pads PD may at least partially overlap with the anti-reflection member RPP. Other components are substantially the same as corresponding components described with reference to FIG. 2A, and thus the descriptions thereof are omitted to avoid redundancy.

Figure 3:
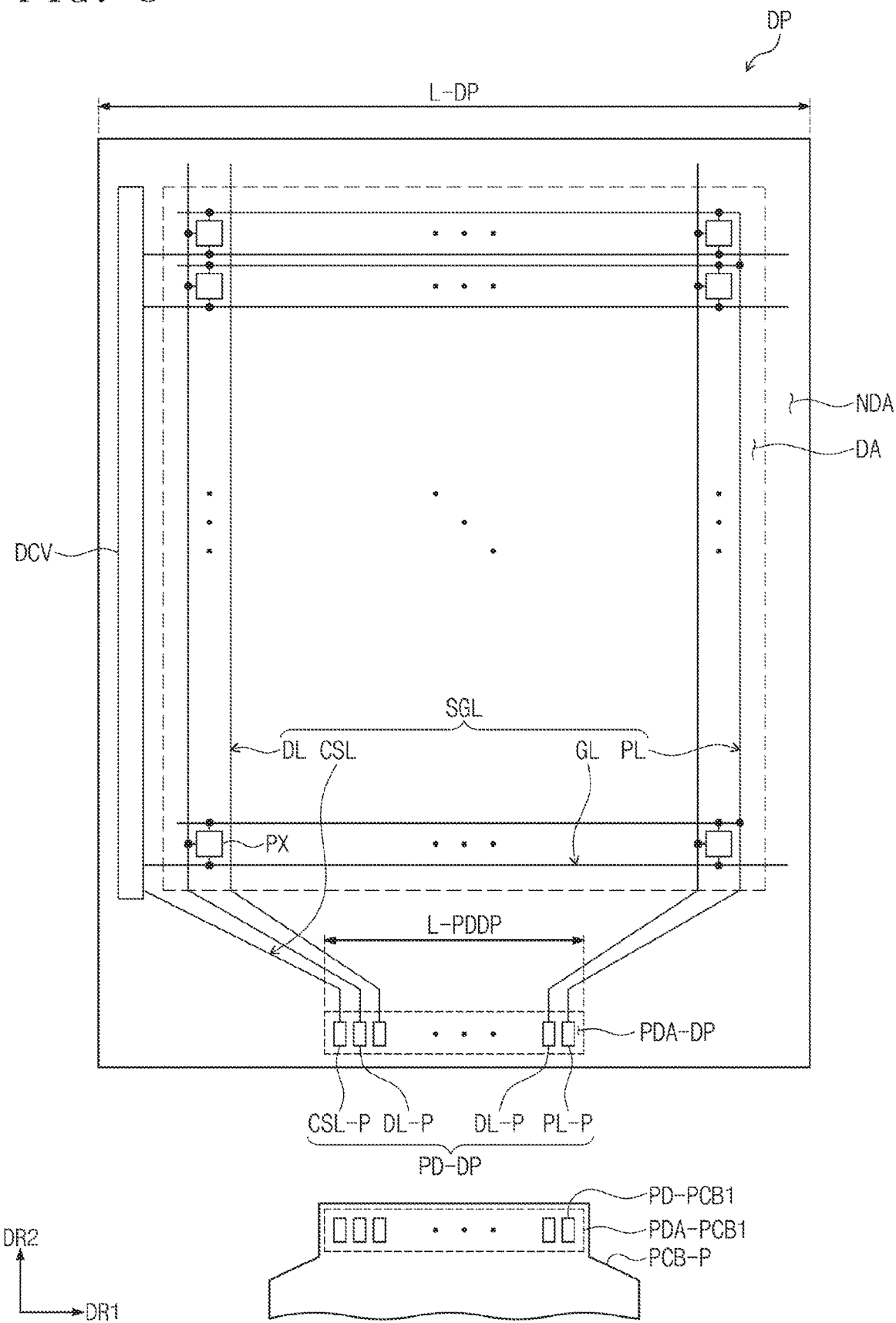
FIG. 3 is a plan view of a display panel according to an exemplary embodiment of the invention.
Figure 4:
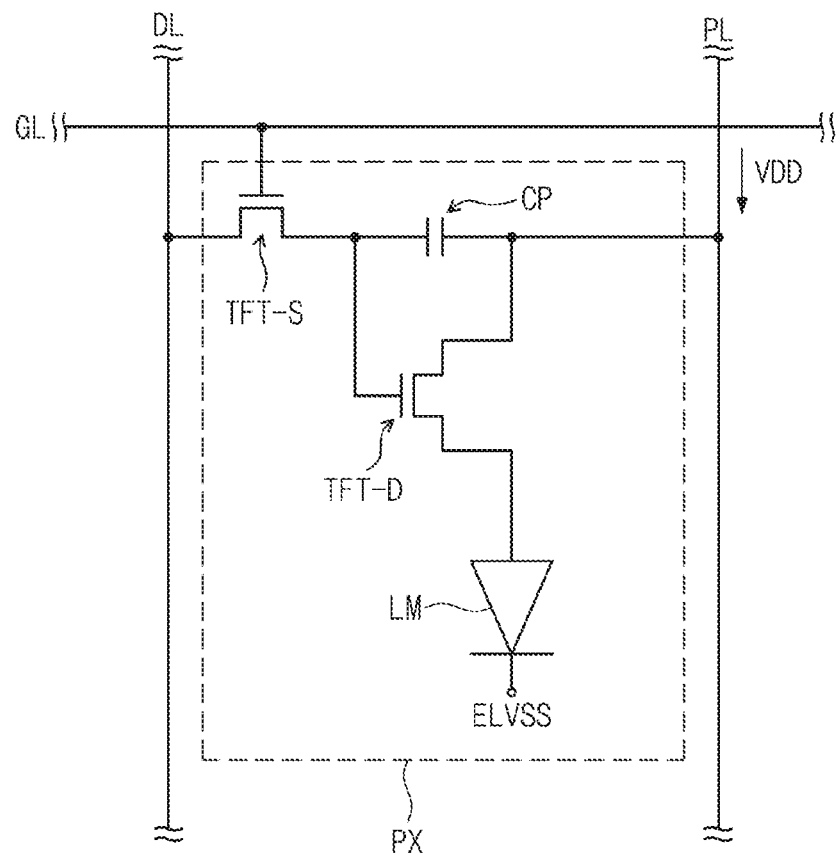
FIG. 4 is an equivalent circuit diagram of a representative pixel of FIG. 3.

FIG. 3 is a plan view of the display panel DP according to an exemplary embodiment of the invention. FIG. 4 is an equivalent circuit diagram of a representative pixel PX of FIG. 3.

Referring to FIG. 3, the display panel DP includes the display area DA and the non-display area NDA when viewed in a plan view. The display area DA and the non-display area NDA of the display panel DP correspond to the display area DD-DA and the non-display area DD-NDA of the display device DD (see FIG. 1), respectively. However, the display area DA and the non-display area NDA of the display panel DP may not need to be the same as the display area DD-DA and the non-display area DD-NDA of the display device DD but may be changed according to a structure and/or a design of the display panel DP.

The display panel DP includes a plurality of signal lines SGL and a plurality of pixels PX. An area in which the plurality of pixels PX is disposed is defined as the display area DA. In the illustrated embodiment, the non-display area NDA may be defined along a border of the display area DA.

The plurality of signal lines SGL may include gate lines GL, data lines DL, a power line PL, and a control signal line CSL. Each of the gate lines GL is connected to corresponding ones of the plurality of pixels PX, and each of the data lines DL is connected to corresponding ones of the plurality of pixels PX. The power line PL is connected to the plurality of pixels PX. A gate driving circuit DCV to which the gate lines GL are connected may be disposed in one side portion of the non-display area NDA. The control signal line CSL may provide control signals to the gate driving circuit DCV.

Each of the gate lines GL, the data lines DL, the power line PL and the control signal line CSL may include a signal interconnection portion, and ends of the signal interconnection portions are connected to display pads PD-DP. An area in which the display pads PD-DP are disposed may be defined as a display pad area PDA-DP. The display pad area PDA-DP is included in the non-display area NDA.

The signal interconnection portion may be defined as a portion of each of the gate lines GL, the data lines DL, the power line PL and the control signal line CSL except the display pads PD-DP.

In an embodiment of the invention, the display pads PD-DP may be formed in the same process as transistors for driving the pixels PX. For example, the display pads PD-DP and the transistors for driving the pixels PX may be formed in the same low-temperature polycrystalline silicon (LTPS) process or the same low-temperature polycrystalline oxide (LTPO) process.

In an embodiment of the invention, the display pads PD-DP may include a control pad CSL-P, a data pad DL-P, and a power pad PL-P. A gate pad is not illustrated. However, the gate pad may overlap with the gate driving circuit DCV and may be connected to the gate driving circuit DCV.

The first printed circuit board PCB-P may be electrically connected to the display pad area PDA-DP. The first printed circuit board PCB-P may be a rigid circuit board or a flexible circuit board. The first printed circuit board PCB-P may be connected directly to the display panel DP or may be connected to the display panel DP through still another circuit board.

A signal control circuit (not shown, e.g., a timing controller) for controlling operations of the display panel DP may be disposed on the first printed circuit board PCB-P. In an embodiment of the invention, the signal control circuit may be realized in the form of an integrated chip and may be mounted on the first printed circuit board PCB-P.

The first printed circuit board PCB-P may include a plurality of first PCB pads PD-PCB1. An area in which the first PCB pads PD-PCB1 are disposed may be defined as a first PCB pad area PDA-PCB1.

The representative pixel PX connected to one gate line GL, one data line DL and the power line PL is illustrated as an example in FIG. 4. However, the configuration of the pixel PX may not be limited thereto but may be variously modified.

The pixel PX includes the light emitting element LM used as a display element. The light emitting element LM may be a front surface light emitting type diode or a back surface light emitting type diode. Alternatively, the light emitting element LM may be a both surface light emitting type diode. The light emitting element LM may be an organic light emitting diode. The pixel PX includes a switching transistor TFT-S, a driving transistor TFT-D and a capacitor CP, which constitute a circuit part for driving the light emitting element LM. The light emitting element LM generates light in response to an electrical signal provided from the transistors TFT-S and TFT-D.

The switching transistor TFT-S outputs a data signal, applied to the data line DL, in response to a scan signal applied to the gate line GL. The capacitor CP is charged with a voltage corresponding to the data signal received from the switching transistor TFT-S.

The driving transistor TFT-D is connected to the light emitting element LM. The driving transistor TFT-D controls a driving current flowing through the light emitting element LM in response to the amount of charges stored in the capacitor CP. The light emitting element LM may emit light during a turn-on period of the driving transistor TFT-D.

The power line PL may provide a power voltage VDD to the light emitting element LM.

Figure 5:
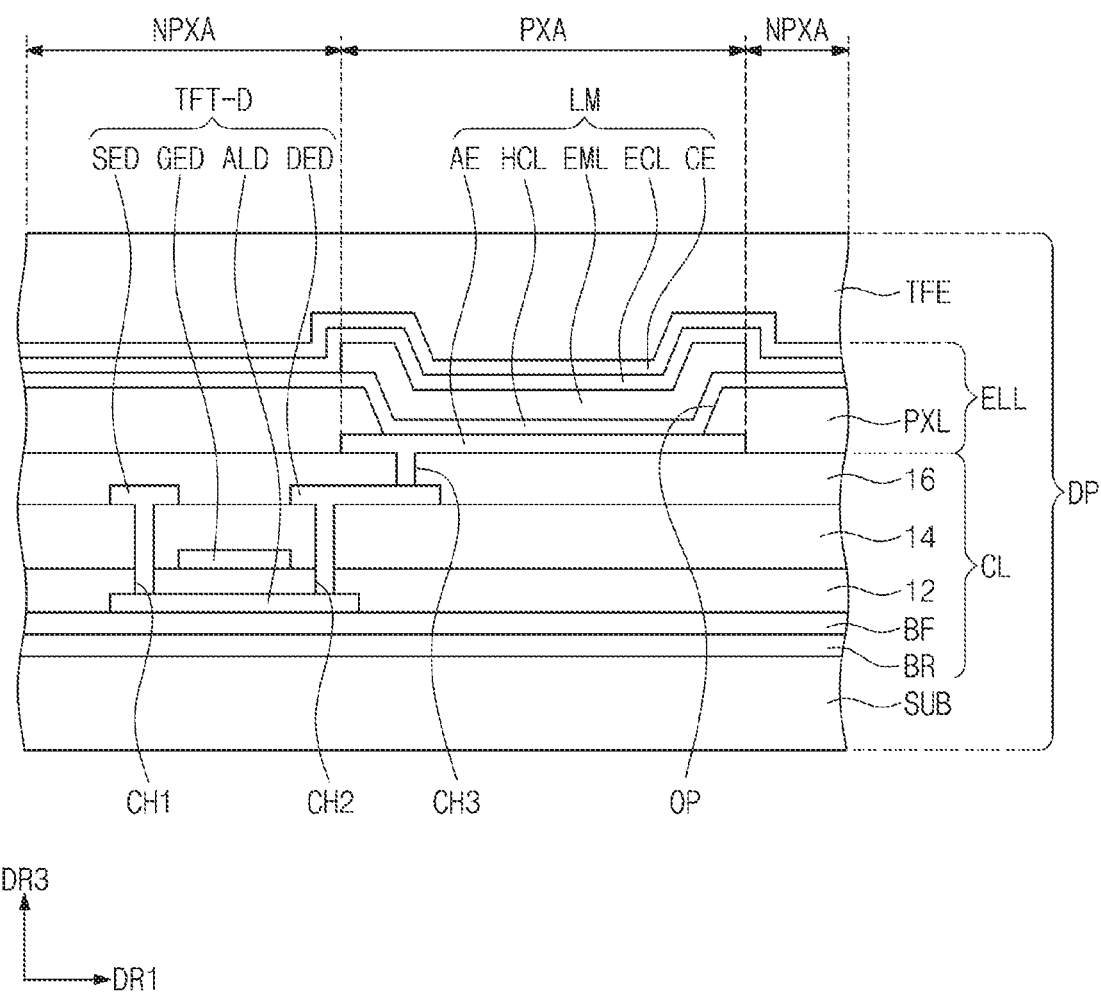
FIG. 5 is a cross-sectional view of the pixel of FIG. 3.

FIG. 5 is a cross-sectional view of the pixel PX of FIG. 3. FIG. 5 illustrates a cross-sectional view of a portion corresponding to the driving transistor TFT-D and the light emitting element LM of the equivalent circuit illustrated in FIG. 4.

As illustrated in FIG. 5, a circuit layer CL is disposed on a base layer SUB. A semiconductor pattern ALD of the driving transistor TFT-D is disposed on the base layer SUB. The semiconductor pattern ALD may include at least one of amorphous silicon, poly-silicon, or a metal oxide semiconductor.

The circuit layer CL may include organic/inorganic layers BR, BF, 12, 14 and 16, the switching transistor TFT-S (see FIG. 4), and the driving transistor TFT-D. The organic/inorganic layers BR, BF, 12, 14 and 16 may include a functional layer BR and BF, a first insulating layer 12, a second insulating layer 14, and a third insulating layer 16.

The functional layer BR and BF may be disposed on one surface of the base layer SUB. The functional layer BR and BF includes at least one of a barrier layer BR or a buffer layer BF. The semiconductor pattern ALD may be disposed on the barrier layer BR or the buffer layer BF.

The first insulating layer 12 is disposed on the base layer SUB to cover the semiconductor pattern ALD. The first insulating layer 12 includes an organic layer and/or an inorganic layer. In particular, the first insulating layer 12 may include a plurality of inorganic thin layers. The plurality of inorganic thin layers may include a silicon nitride layer and a silicon oxide layer.

A control electrode GED of the driving transistor TFT-D is disposed on the first insulating layer 12. Even though not shown in the drawings, a control electrode of the switching transistor TFT-S (see FIG. 4) may also be disposed on the first insulating layer 12. The control electrode GED and the gate line GL (see FIG. 3) may be formed using the same photolithography process. In other words, the control electrode GED and the gate line GL may be formed of the same material, may have the same stack structure, and may be disposed on the same layer.

The second insulating layer 14 is disposed on the first insulating layer 12 to cover the control electrode GED. The second insulating layer 14 includes an organic layer and/or an inorganic layer. In particular, the second insulating layer 14 may include a plurality of inorganic thin layers. The plurality of inorganic thin layers may include a silicon nitride layer and a silicon oxide layer.

The data line DL (see FIG. 3) may be disposed on the second insulating layer 14. An input electrode SED and an output electrode DED of the driving transistor TFT-D are disposed on the second insulating layer 14. Even though not shown in the drawings, an input electrode and an output electrode of the switching transistor TFT-S (see FIG. 4) are also disposed on the second insulating layer 14. The input electrode of the switching transistor TFT-S may be branched from a corresponding one of the data lines DL. The power line PL (see FIG. 3) and the data lines DL may be disposed on the same layer. The input electrode SED of the driving transistor TFT-D may be branched from the power line PL.

A portion of electrodes of the capacitor CP (see FIG. 4) is disposed on the second insulating layer 14. The portion of the electrodes of the capacitor CP (see FIG. 4), the data lines DL and the power line PL may be formed using the same photolithography process, may have the same material and the same stack structure, and may be disposed on the same layer.

The input electrode SED and the output electrode DED are connected to portions of the semiconductor pattern ALD through a first through-hole CH1 and a second through-hole CH2 penetrating the first and second insulating layers 12 and 14, respectively. On the other hand, in another embodiment of the invention, the switching transistor TFT-S (see FIG. 4) and the driving transistor TFT-D may have bottom gate structures.

The third insulating layer 16 is disposed on the second insulating layer 14 to cover the input electrode SED and the output electrode DED. The third insulating layer 16 includes an organic layer and/or an inorganic layer. In particular, the third insulating layer 16 may include an organic material to provide a flat surface.

One of the first, second and third insulating layers 12, 14 and 16 may be omitted according to the circuit structure of the pixel PX. Each of the second and third insulating layers 14 and 16 may be defined as an interlayer insulating layer. The interlayer insulating layer is disposed between a conductive pattern disposed thereunder and a conductive pattern disposed thereon to insulate the conductive patterns from each other.

A light emitting element layer ELL is disposed on the third insulating layer 16. The light emitting element layer ELL includes a pixel defining layer PXL and the light emitting element LM. An anode AE is disposed on the third insulating layer 16. The anode AE is connected to the output electrode DED of the driving transistor TFT-D through a third through-hole CH3 penetrating the third insulating layer 16. An opening OP is defined in the pixel defining layer PXL. The opening OP of the pixel defining layer PXL exposes a portion of the anode AE.

The light emitting element layer ELL includes a light emitting area PXA and a non-light emitting area NPXA adjacent to the light emitting area PXA. The non-light emitting area NPXA may surround the light emitting area PXA. In the illustrated embodiment, the light emitting area PXA is defined to correspond to the anode AE. However, the light emitting area PXA is not limited thereto. In other words, it is sufficient that the light emitting area PXA is defined as an area from which light is generated. In certain embodiments, the light emitting area PXA may be defined to correspond to the portion of the anode AE, which is exposed by the opening OP.

A hole control layer HCL may be disposed in common in both the light emitting area PXA and the non-light emitting area NPXA. Even though not shown in the drawings, a common layer such as the hole control layer HCL may be formed in common in the plurality of pixels PX (see FIG. 3).

A light emitting layer EML is disposed on the hole control layer HCL. The light emitting layer EML may be disposed in only an area corresponding to the opening OP. In other words, the light emitting layers EML respectively formed in the pixels PX may be separated from each other.

The light emitting layer EML may include an organic material or an inorganic material.

An electron control layer ECL is disposed on the light emitting layer EML. A cathode CE is disposed on the electron control layer ECL. The cathode CE may be disposed in common in the plurality of pixels PX.

In the illustrated embodiment, the patterned light emitting layer EML is illustrated as an example. However, in another embodiment, the light emitting layer EML may be disposed in common in the plurality of pixels PX. In this case, the light emitting layer EML may generate white light. In some embodiments, the light emitting layer EML may have a multi-layered structure.

In the illustrated embodiment, a thin film encapsulation layer TFE directly covers the cathode CE. In an embodiment of the invention, a capping layer covering the cathode CE may further be disposed. In this case, the thin film encapsulation layer TFE may directly cover the capping layer. The thin film encapsulation layer TFE may include an organic layer including an organic material and an inorganic layer including an inorganic material.

Figure 6:
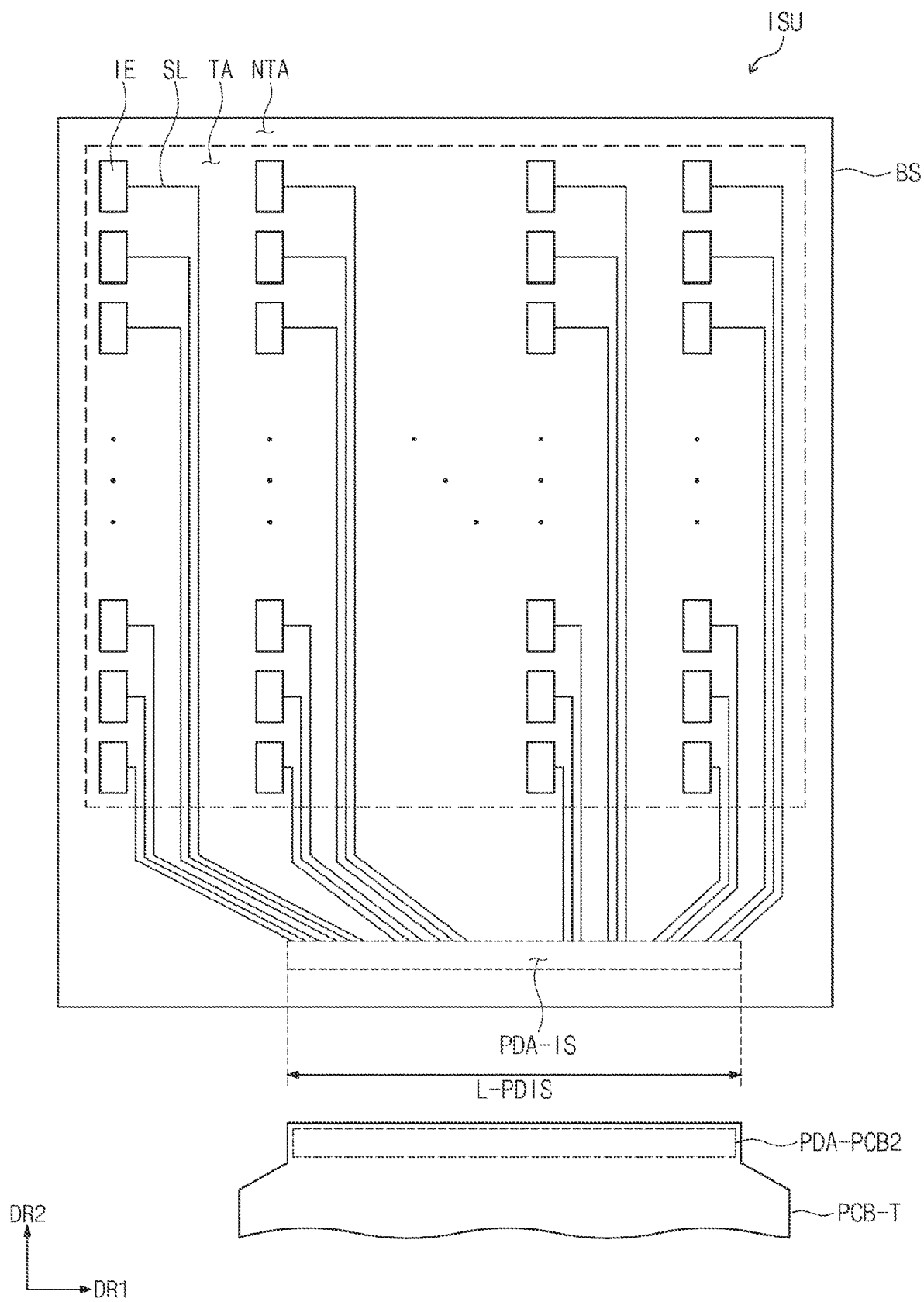
FIG. 6 is a plan view of an exemplary embodiment of an input sensing unit constructed according to the principles of the invention.

FIG. 6 is a plan view of an exemplary embodiment of an input sensing unit ISU constructed according to the principles of the invention.

Referring to FIG. 6, the input sensing unit ISU includes an input sensing area TA and a non-input sensing area NTA when viewed in a plan view. The input sensing area TA and the non-input sensing area NTA of the input sensing unit ISU correspond to the display area DD-DA and the non-display area DD-NDA of the display device DD (see FIG. 1), respectively. However, the input sensing area TA and the non-input sensing area NTA of the input sensing unit ISU may not need to be the same as the display area DD-DA and the non-display area DD-NDA of the display device DD but may be changed according to a structure and/or a design of the input sensing unit ISU.

In an embodiment of the invention, the input sensing unit ISU may sense a touch or contact provided to the input sensing surface by a self-capacitive method.

The input sensing unit ISU includes a plurality of signal lines SL and a plurality of sensing electrodes IE. An area in which the sensing electrodes IE are disposed is defined as the input sensing area TA. In the illustrated embodiment, the non-input sensing area NTA may be defined along a border of the input sensing area DA.

The sensing electrodes IE may be arranged in a matrix form. Each of the sensing electrodes IE may be insulated from other sensing electrodes IE in the input sensing area TA.

The signal lines SL are connected to corresponding sensing electrodes IE, respectively. The signal lines SL may be connected to the sensing electrodes IE in one-to-one correspondence.

The signal lines SL are connected to corresponding sensing pads PD (see FIG. 7), respectively. The signal lines SL may be connected to the sensing pads PD in one-to-one correspondence.

The signal lines SL may transmit signals, which correspond to changes in capacitance of the sensing electrodes IE by an external object capacitively coupled to the sensing electrodes IE, to the sensing pads PD.

An area in which the sensing pads PD are disposed may be defined as a sensing pad area PDA-IS. The sensing pad area PDA-IS is included in the non-input sensing area NTA.

The sensing pad area PDA-IS may be electrically connected to the second printed circuit board PCB-T. The second printed circuit board PCB-T may be a rigid circuit board or a flexible circuit board. The second printed circuit board PCB-T may be connected directly to the input sensing unit ISU or may be connected to the input sensing unit ISU through still another circuit board.

A signal control circuit (not shown) for controlling operations of the input sensing unit ISU may be disposed on the second printed circuit board PCB-T. In an embodiment of the invention, the signal control circuit may be realized in the form of an integrated chip and may be mounted on the second printed circuit board PCB-T.

The second printed circuit board PCB-T may include a plurality of second PCB pads (not shown). An area in which the plurality of second PCB pads is disposed may be defined as a second PCB pad area PDA-PCB2. The second PCB pads may be connected to the sensing pads PD through the anisotropic conductive film ACF (see FIG. 2A).

Referring to FIGS. 3 and 6, a length of the sensing pad area PDA-IS in the first direction DR1 may be defined as a first length L-PDIS, and a length of the display pad area PDA-DP in the first direction DR1 may be defined as a second length L-PDDP. A length of the display panel DP in the first direction DR1 may be defined as a third length L-DP.

In an embodiment of the invention, the second length L-PDDP may be equal to or greater than 45% and less than 55% of the third length L-DP. If the second length L-PDDP is less than 45% of the third length L-DP, there may not be enough space to dispose a sufficient number of the display pads PD-DP in the display pad area PDA-DP or the distance between the display pads PD-DP may be too small and a process error or defect will result. If the second length L-PDDP is greater than 55% of the third length L-DP, the amount of area overlapping the display pad area PDA-DP and the sensing pad area PDA-IS of the input sensing unit ISU may increase and a process error or defect will result. However, the relation between the second length L-PDDP and the third length L-DP is not limited to the specific values above.

In an embodiment of the invention, the first length L-PDIS may be shorter than the second length L-PDDP. For example, the first length L-PDIS may be equal to or greater than 35% and less than 45% of the third length L-DP, and the second length L-PDDP may be equal to or greater than 45% and less than 55% of the third length L-DP.

For example, the first length L-PDIS may be equal to or greater than 75% and equal to or less than 85% of the second length L-PDDP. If the first length L-PDIS is less than 75% of the second length L-PDDP, there may not be enough space to dispose a sufficient number of the sensing pads PD in the sensing pad area PDA-IS or the distance between the sensing pads PD may be too small and a process error or defect will result. If the first length L-PDIS is greater than 85% of the second length L-PDDP, the amount of area the sensing pad area PDA-IS and the display pad area PDA-DP of the display panel DP may increase and a process error or defect will result. However, the relation between the first length L-PDIS and the second length L-PDDP is not limited to the specific values above.

In another embodiment of the invention, the first length L-PDIS may be longer than the second length L-PDDP. For example, the first length L-PDIS may be equal to or greater than 110% and equal to or less than 130% of the second length L-PDDP.

Figure 7:
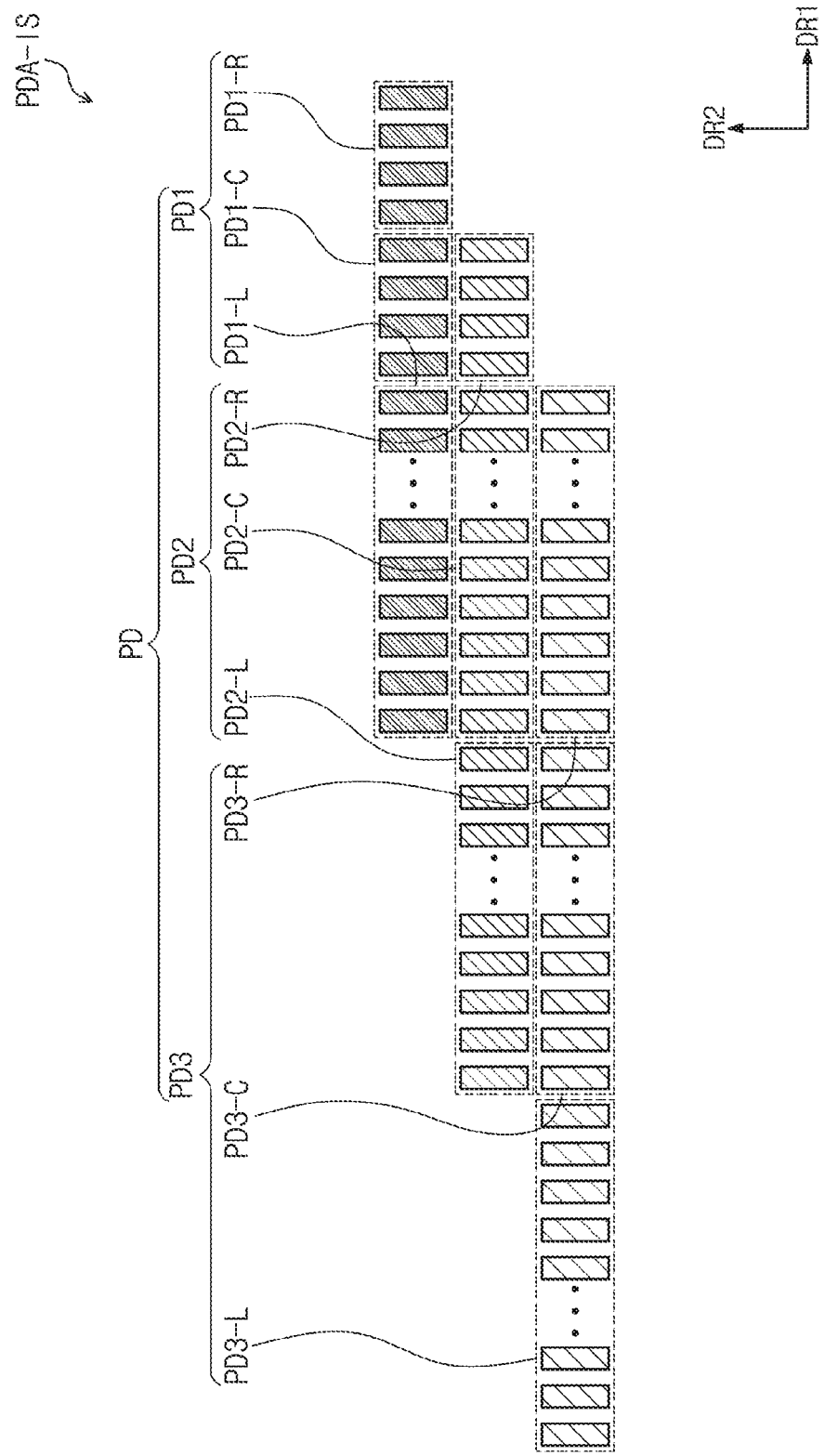
FIG. 7 is a plan view showing an exemplary embodiment of a sensing pad area of FIG. 6.

FIG. 7 illustrates the sensing pad area PDA-IS of FIG. 6. In FIG. 7, the sensing pads PD are illustrated but the signal lines are not illustrated for the purpose of ease and convenience in description and illustration.

The sensing pads PD may be arranged in a non-linear configuration, such as plurality of rows of columns, which may be staggered or irregular. As used herein, "non-linear configuration" means any regular or irregular configuration of pads other than a single, substantially straight line. For example, the sensing pads PD may be arranged in three rows having an equal or unequal number of pads PD.

In the case in which the sensing pads PD are arranged in three rows, the sensing pads PD may include a plurality of first sensing pads PD1 arranged in a first row, a plurality of second sensing pads PD2 arranged in a second row, and a plurality of third sensing pads PD3 arranged in a third row.

The first sensing pads PD1 may be arranged in the first direction DR1, the second sensing pads PD2 may be arranged in the first direction DR1, and the third sensing pads PD3 may also be arranged in the first direction DR1.

The first sensing pads PD1 may include first left sensing pads PD1-L, first central sensing pads PD1-C, and first right sensing pads PD1-R.

The first left sensing pads PD1-L may overlap with the second sensing pads PD2 and the third sensing pads PD3 in the second direction DR2. The first central sensing pads PD1-C may overlap with only the second sensing pads PD2 of the sensing pads PD in the second direction DR2. The first right sensing pads PD1-R may not overlap with the second sensing pads PD2 and the third sensing pads PD3 in the second direction DR2.

The second sensing pads PD2 may include second left sensing pads PD2-L, second central sensing pads PD2-C, and second right sensing pads PD2-R.

The second left sensing pads PD2-L may overlap with only the third sensing pads PD3 of the sensing pads PD in the second direction DR2. The second central sensing pads PD2-C may overlap with the first sensing pads PD1 and the third sensing pads PD3 in the second direction DR2. The second right sensing pads PD2-R may overlap with only the first sensing pads PD1 of the sensing pads PD in the second direction DR2.

The third sensing pads PD3 may include third left sensing pads PD3-L, third central sensing pads PD3-C, and third right sensing pads PD3-R.

The third left sensing pads PD3-L may not overlap with the first sensing pads PD1 and the second sensing pads PD2 in the second direction DR2. The third central sensing pads PD3-C may overlap with only the second sensing pads PD2 of the sensing pads PD in the second direction DR2. The third right sensing pads PD3-R may overlap with the first sensing pads PD1 and the second sensing pads PD2 in the second direction DR2.

However, the arrangement of the sensing pads PD is not be limited to the arrangement of FIG. 7 but may be variously changed. For example, the sensing pads PD may be arranged in rows more or less than three rows. In addition, the number of pads overlapping each of the arranged rows and other row(s) may also be variously changed to produce different configurations of overlapping pads.

Figure 8:
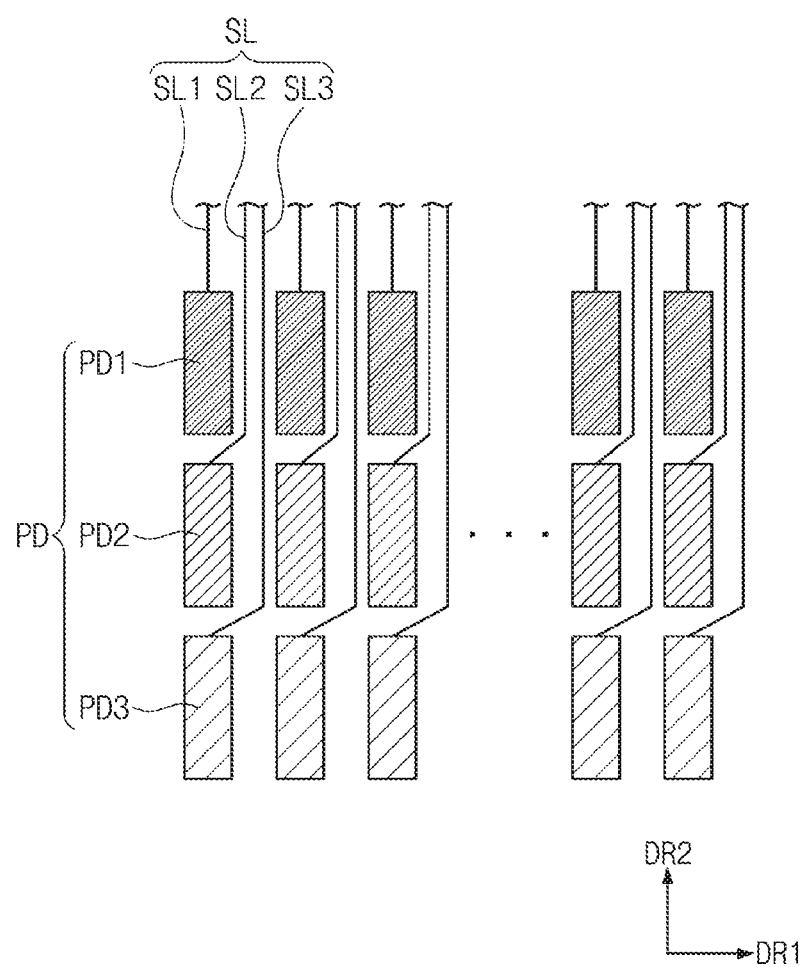
FIG. 8 is a plan view of some of the sensing pads of FIG. 7 and signal lines connected thereto.

FIG. 8 illustrates some of the sensing pads PD of FIG. 7 and the signal lines SL connected thereto.

The signal lines SL include first signal lines SL1, second signal lines SL2, and third signal lines SL3. The first signal lines SL1 are connected to the first sensing pads PD1. The second signal lines SL2 are connected to the second sensing pads PD2. The third signal lines SL3 are connected to the third sensing pads PD3.

In an embodiment of the invention, when the number of the signal lines SL disposed between two first sensing pads PD1 adjacent to each other is 'n' (where 'n' is a natural number equal to or greater than 2), the number of the signal lines SL disposed between two second sensing pads PD2 adjacent to each other may be 'm' less than 'n' (where 'm' is a natural number equal to or greater than 1). FIG. 8 illustrates a case of n=2 and m=1. However, embodiments of the invention are not limited thereto.

FIG. 8 illustrates the sensing pads PD arranged at equal distances in the first direction DR1. However, embodiments of the invention are not limited thereto. In another embodiment of the invention, the distances between the sensing pads PD in the first direction DR1 may be different.

The sensing pads PD may be connected to the signal lines SL in one-to-one correspondence. For example, as illustrated in FIG. 6, the signal lines SL may be connected to the sensing electrodes IE in one-to-one correspondence. To sense a touch or contact by the self-capacitive method, the signal control circuit controlling the input sensing unit ISU receives a signal from each of the sensing electrodes IE and provides a signal to each of the sensing electrodes IE. Thus, the sensing electrodes IE are connected to the signal lines SL and the sensing pads PD in one-to-one correspondence.

Figure 9:
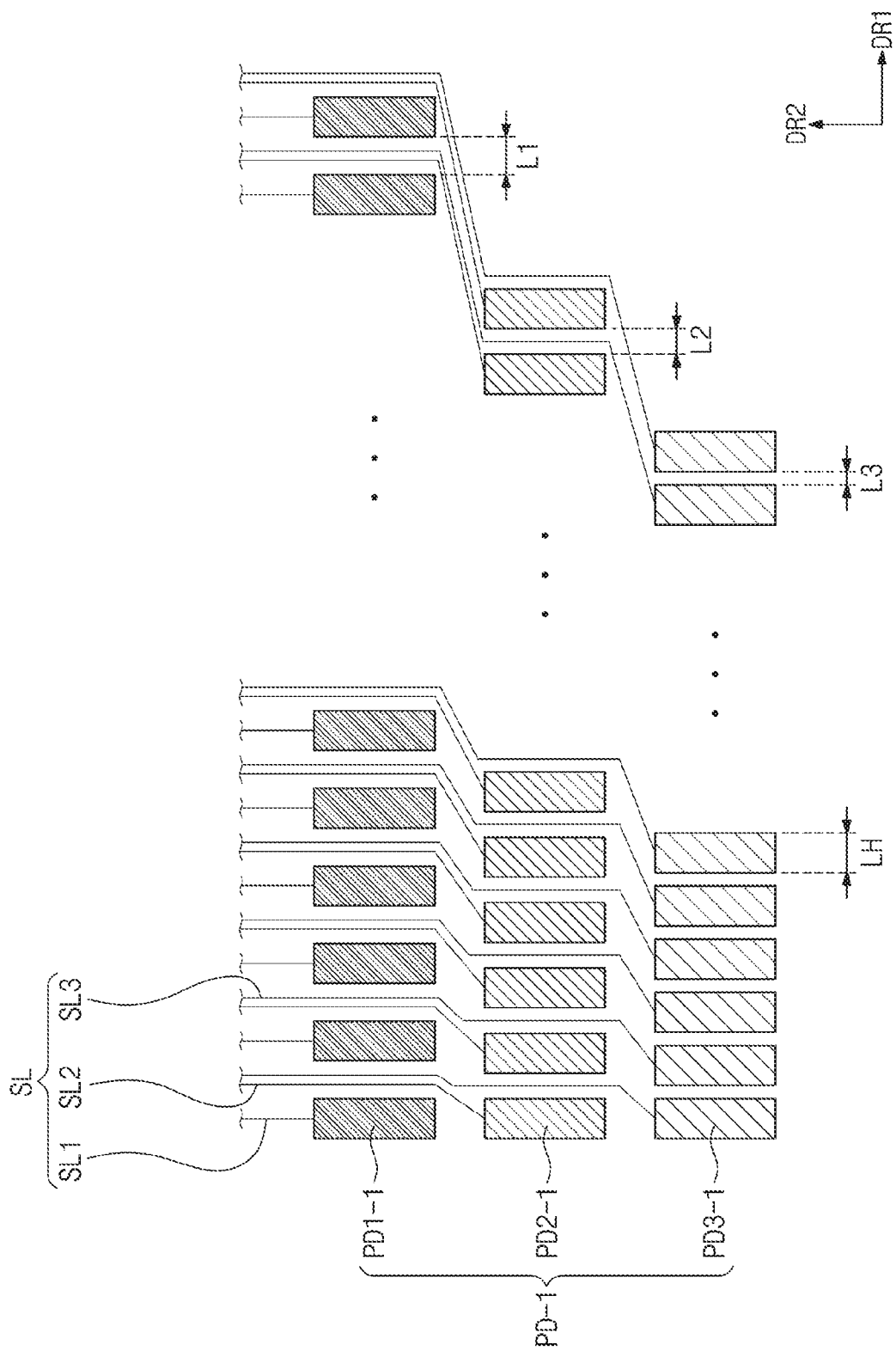
FIG. 9 is a plan view of some of the sensing pads of FIG. 7 and signal lines connected thereto.

FIG. 9 illustrates some of sensing pads PD-1 and signal lines SL connected to the sensing pads PD-1, according to an embodiment of the invention.

The sensing pads PD-1 of FIG. 9 may include first sensing pads PD1-1, second sensing pads PD2-1, and third sensing pads PD3-1. A distance L1 (hereinafter, referred to as 'a first distance') between the first sensing pads PD1-1 in the first direction DR1, a distance L2 (hereinafter, referred to as 'a second distance') between the second sensing pads PD2-1 in the first direction DR1, and a distance L3 (hereinafter, referred to as 'a third distance') between the third sensing pads PD3-1 in the first direction DR1 are different from each other, unlike the sensing pads PD of FIG. 8.

The first distance L1 is greater than the second distance L2, and the second distance L2 is greater than the third distance L3.

Since the first distance L1 is greater than the second distance L2, the number of the signal lines SL between the first sensing pads PD1-1 can be increased more than the number of the signal lines SL between the second sensing pads PD2-1 without a process error.

A width LH (hereinafter, referred to as 'a sensing pad width') of each of the sensing pads PD-1 may range from 90

μm to 100 μm. If the sensing pad width LH is less than 90 μm, conductive balls of the anisotropic conductive film ACF may not be in contact with the sensing pads PD-1 accurately. If the sensing pad width LH is greater than 100 μm, the sensing pad area PDA-IS may be too wide.

When the sensing pads PD or PD-1 are arranged like FIGS. 7 and 8 or FIG. 9, the sensing pad area PDA-IS may not overlap with the display pad area PDA-DP in a plan view, or an overlapping portion of the sensing pad area PDA-IS and the display pad area PDA-DP in a plan view may be very small. Thus, the stability of processes of manufacturing the display device DD can be improved. More specifically, for example, the risk of over-heating overlapping components, e.g., when attaching PCB-P and PCB-T to the display panel may be reduced or eliminated.

Figure 10:
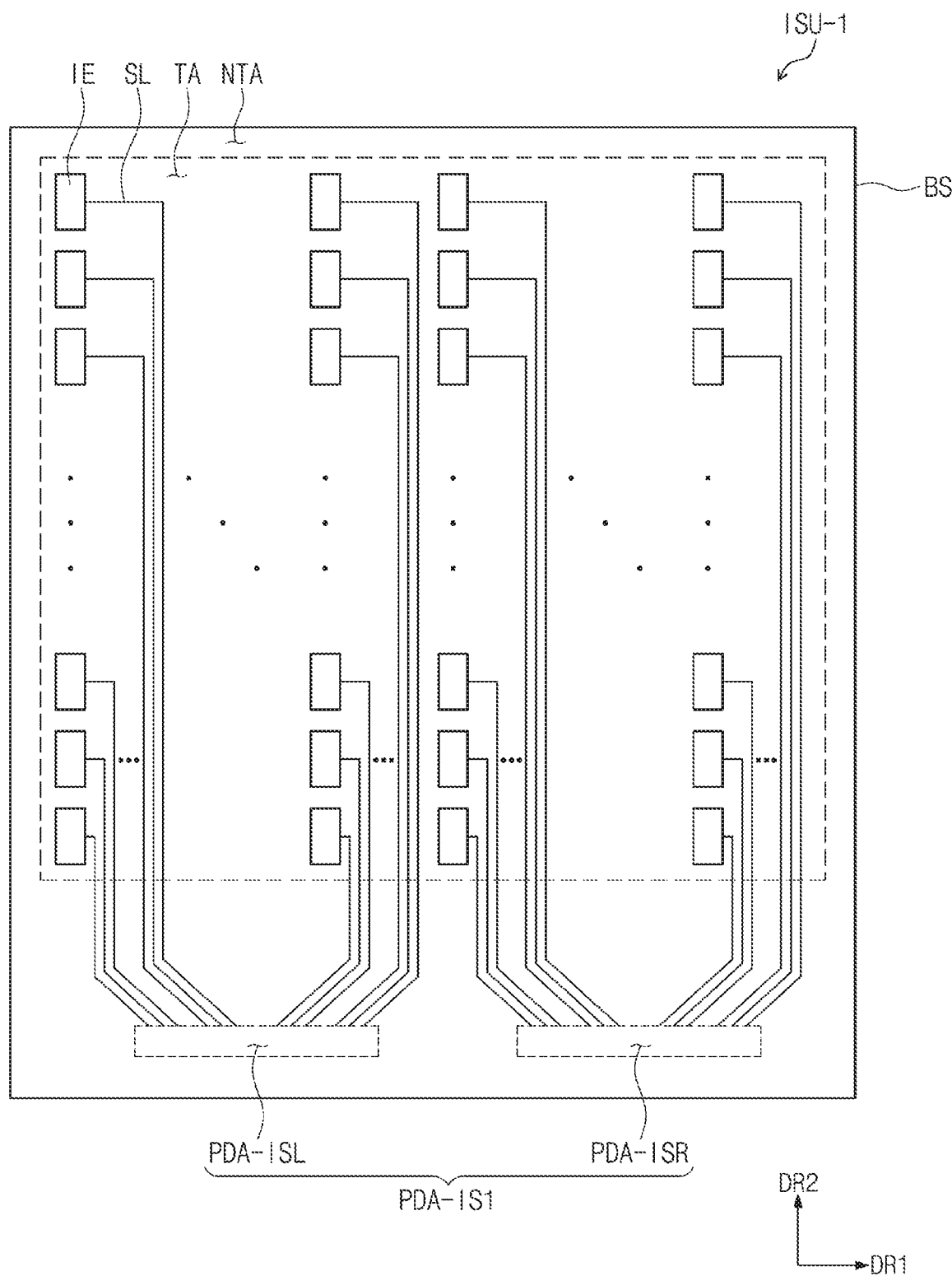
FIG. 10 is a plan view of another exemplary embodiment of an input sensing unit constructed according to the principles of the invention.
Figure 11:
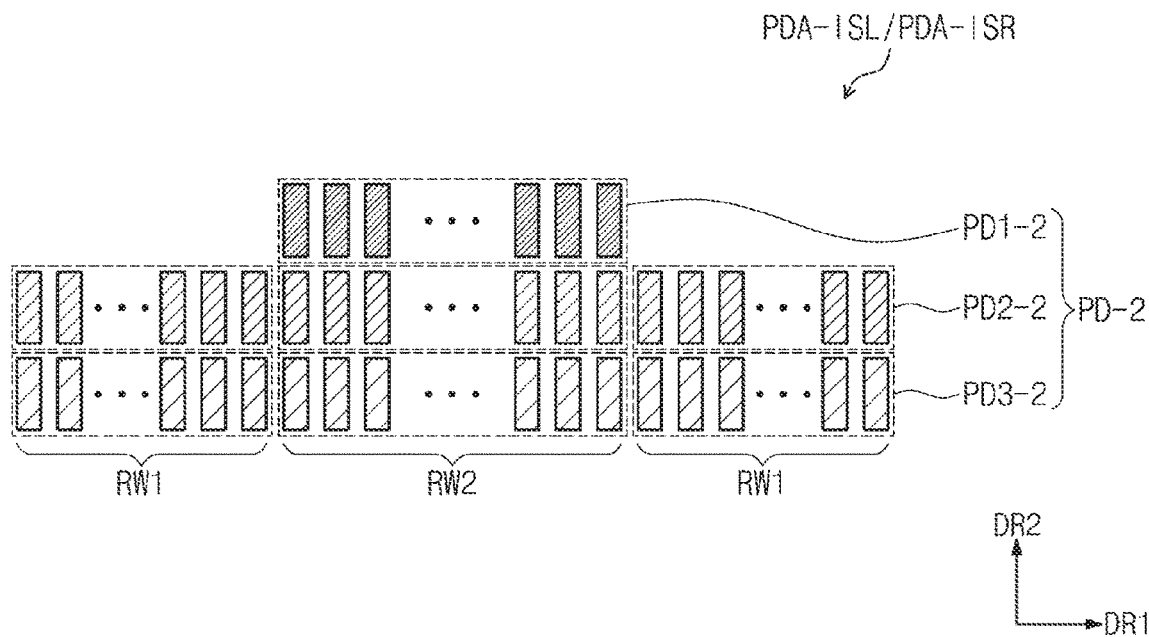
FIG. 11 is a plan view of sensing pads disposed in a left sensing pad area or a right sensing pad area of FIG. 10.

FIG. 10 is a plan view of another exemplary embodiment of an input sensing unit ISU-1 constructed according to the principles of the invention. FIG. 11 illustrates sensing pads PD-2 disposed in a left sensing pad area PDA-ISL or a right sensing pad area PDA-ISR of FIG. 10. In FIG. 11, the sensing pads PD-2 are illustrated but signal lines are not illustrated for the purpose of ease and convenience of description and illustration.

A sensing pad area PDA-IS1 of FIG. 10 may be divided into two areas, unlike the sensing pad area PDA-IS of FIG. 6. The sensing pad area PDA-IS1 may include a left sensing pad area PDA-ISL and a right sensing pad area PDA-ISR.

In an embodiment of the invention, the left sensing pad area PDA-ISL or the right sensing pad area PDA-ISR may not overlap with the display pad area PDA-DP when viewed in a plan view.

In an embodiment of the invention, a right portion of the left sensing pad area PDA-ISL may overlap with a left portion of the display pad area PDA-DP when viewed in a plan view. A left portion of the right sensing pad area PDA-ISR may overlap with a right portion of the display pad area PDA-DP when viewed in a plan view.

Referring to FIG. 11, the sensing pads PD-2 in the left sensing pad area PDA-ISL may be arranged in substantially the same form as the sensing pads PD-2 in the right sensing pad area PDA-ISR.

The sensing pads PD-2 may arranged in a non-linear configuration, e.g., pads PD-2 may include a plurality of first sensing pads PD1-2 arranged in a first row, a plurality of second sensing pads PD2-2 arranged in a second row, and a plurality of third sensing pads PD3-2 arranged in a third row.

The sensing pads PD-2 may be divided into a two-row arrangement area RW1 and a three-row arrangement area RW2 by an imaginary boundary line parallel to the second direction DR2.

Sensing pads, disposed in left and right areas, of the second and third sensing pads PD2-2 and PD3-2 may be disposed in the two-row arrangement area RW1. The first sensing pads PD1-2 and sensing pads, disposed in a central area, of the second and third sensing pads PD2-2 and PD3-2 may be disposed in the three-row arrangement area RW2.

Figure 12:
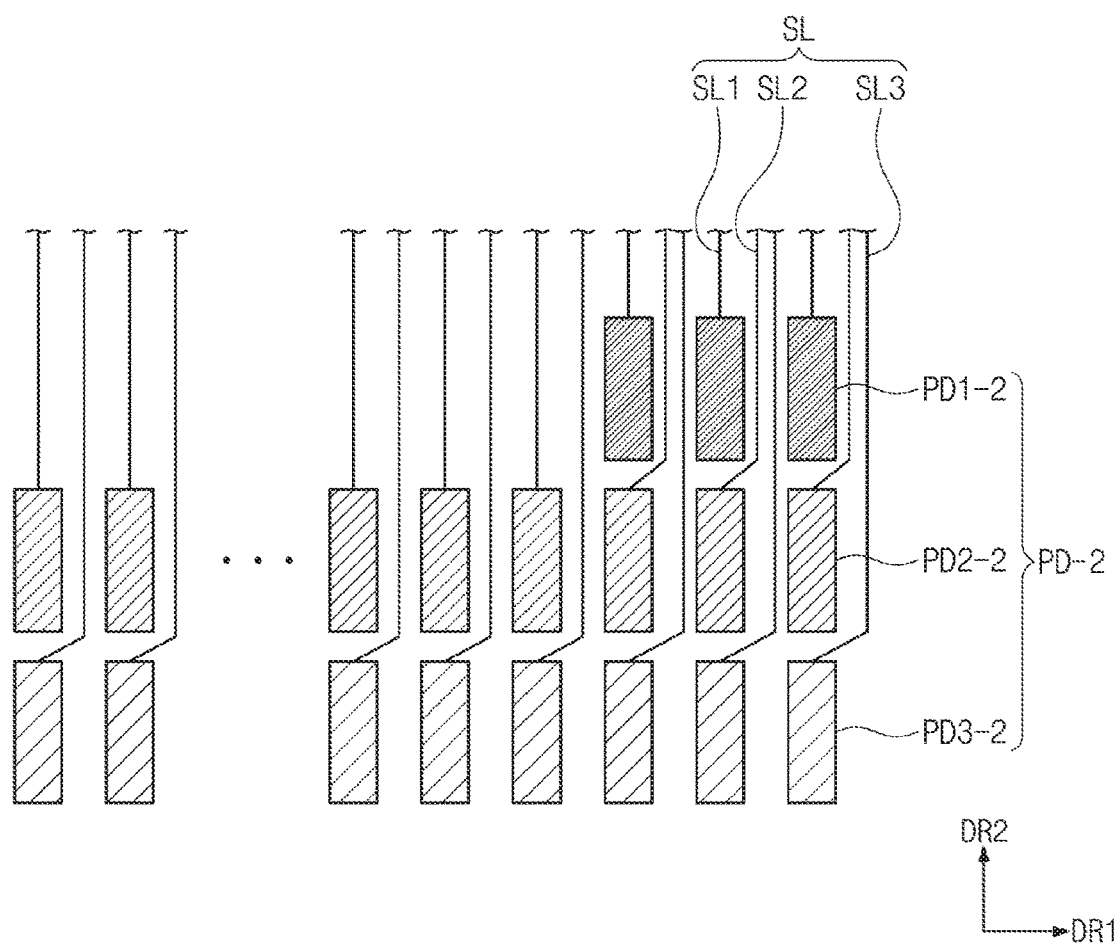
FIG. 12 is a plan view of some of the sensing pads of FIG. 11 and signal lines connected thereto.

FIG. 12 illustrates some of the sensing pads PD-2 of FIG. 11 and signal lines SL connected thereto.

First signal lines SL1 are connected to the first sensing pads PD1-2. Second signal lines SL2 are connected to the second sensing pads PD2-2. Third signal lines SL3 are connected to the third sensing pads PD3-2. Descriptions of other elements are substantially the same as those described with reference to FIG. 8 and thus are omitted to avoid redundancy.

Figure 13:
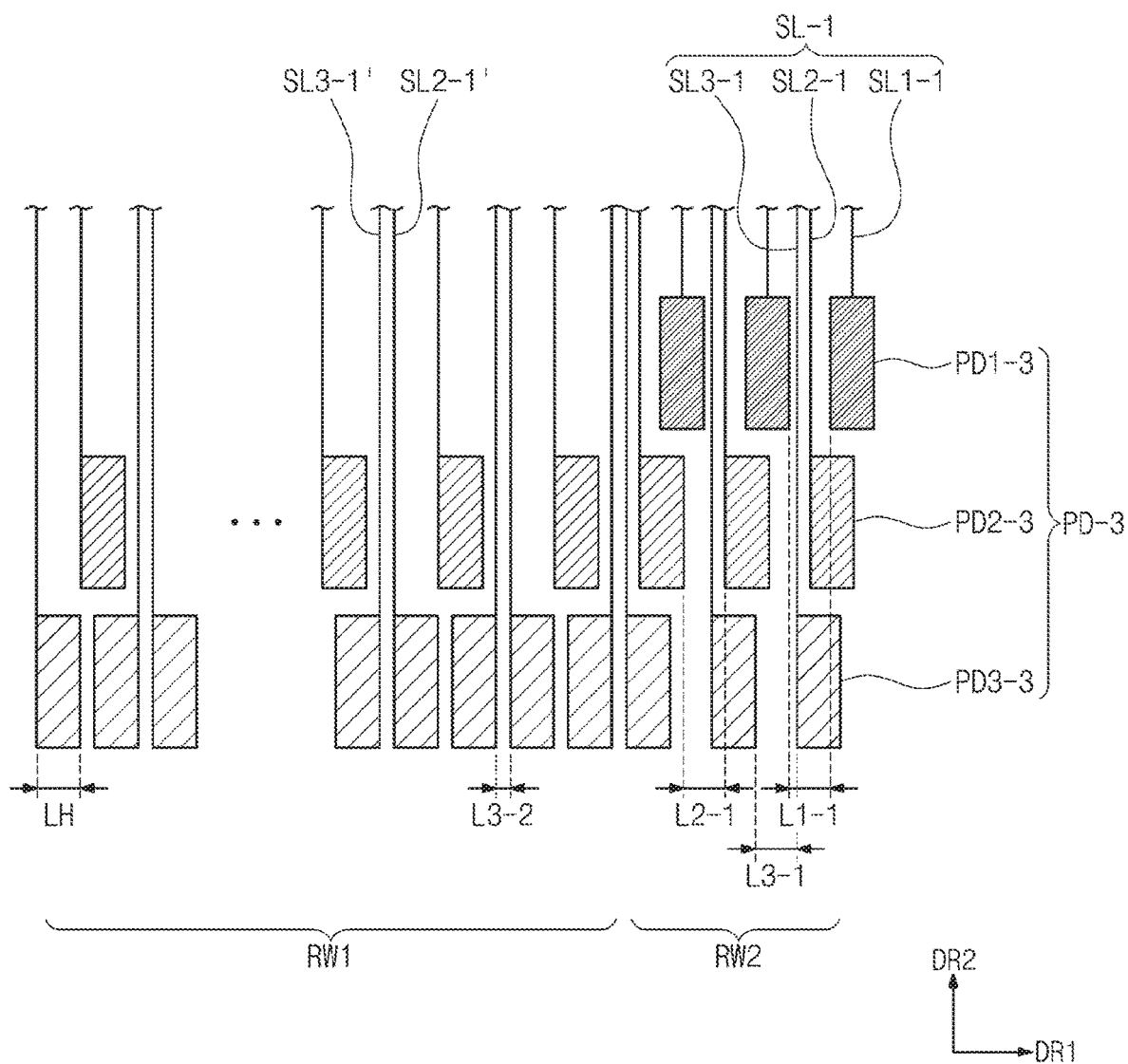
FIG. 13 is a plan view of some of sensing pads of FIG. 11 and signal lines connected thereto.

FIG. 13 illustrates some of sensing pads PD-3 and signal lines SL-1 connected to the sensing pads PD-3, according to an embodiment of the invention.

The signal lines SL-1 of FIG. 13 may extend substantially straight in the second direction DR2, unlike the signal lines SL described above. In other words, the signal lines SL-1 of FIG. 13 may not include bent portions between the sensing pads PD-3. In the case in which the signal lines SL-1 extend substantially straight like this, the process of changing extending directions of signal lines may not be required. Thus, convenience and stability of manufacturing processes may be improved.

In the case in which the signal lines SL-1 have these shapes, the number of the signal lines SL-1 disposed between the sensing pads PD-3 may be different from the number of the signal lines SL described above.

For example, two signal lines SL-1 may be disposed between the first sensing pads PD1-3 adjacent to each other. Two signal lines SL-1 (e.g., SL3-1', SL2-1') may be disposed between the second sensing pads PD2-3 adjacent to each other in the two-row arrangement area RW1, and one signal line SL-1 (e.g., SL3-1) may be disposed between the second sensing pads PD2-3 adjacent to each other in the three-row arrangement area RW2. In other words, the number of the signal lines SL-1 disposed between the second sensing pads PD2-3 adjacent to each other may be changed according to circumstances.

To change the number of the signal lines SL-1 disposed between the second sensing pads PD2-3 as described above, each of second signal lines SL2-1 may be connected to a right top vertex portion or a left top vertex portion of a corresponding one of the second sensing pads PD2-3 when viewed in a plan view.

Distances L1-1 (first distances) between the first sensing pads PD1-3 may be equal to each other in the three-row arrangement area RW2.

Distances L2-1 (second distances) between the second sensing pads PD2-3 may be constant in the two-row arrangement area RW1 and the three-row arrangement area RW2.

A distance L3-2 (third distance) between the third sensing pads PD3-3 adjacent to each other in the two-row arrangement area RW1 may be different from a distance L3-1 (third distance) between the third sensing pads PD3-3 adjacent to each other in the three-row arrangement area RW2. For example, the third distance L3-1 in the three-row arrangement area RW2 may be greater than the third distance L3-2 in the two-row arrangement area RW1. To adjust these distances L3-1 and L3-2, each of third signal lines SL3-1 may be connected to a right top vertex portion or a left top vertex portion of a corresponding one of the third sensing pads PD3-3 when viewed in a plan view.

However, the first distance L1-1, the second distance L2-1 and the third distances L3-1 and L3-2 may not be limited thereto but may be variously changed according to embodiments of the invention.

The sensing pads PD-3 illustrated in FIG. 13 may be applied to the input sensing unit ISU of FIG. 6 and the input sensing unit ISU-1 of FIG. 10.

Figure 14:
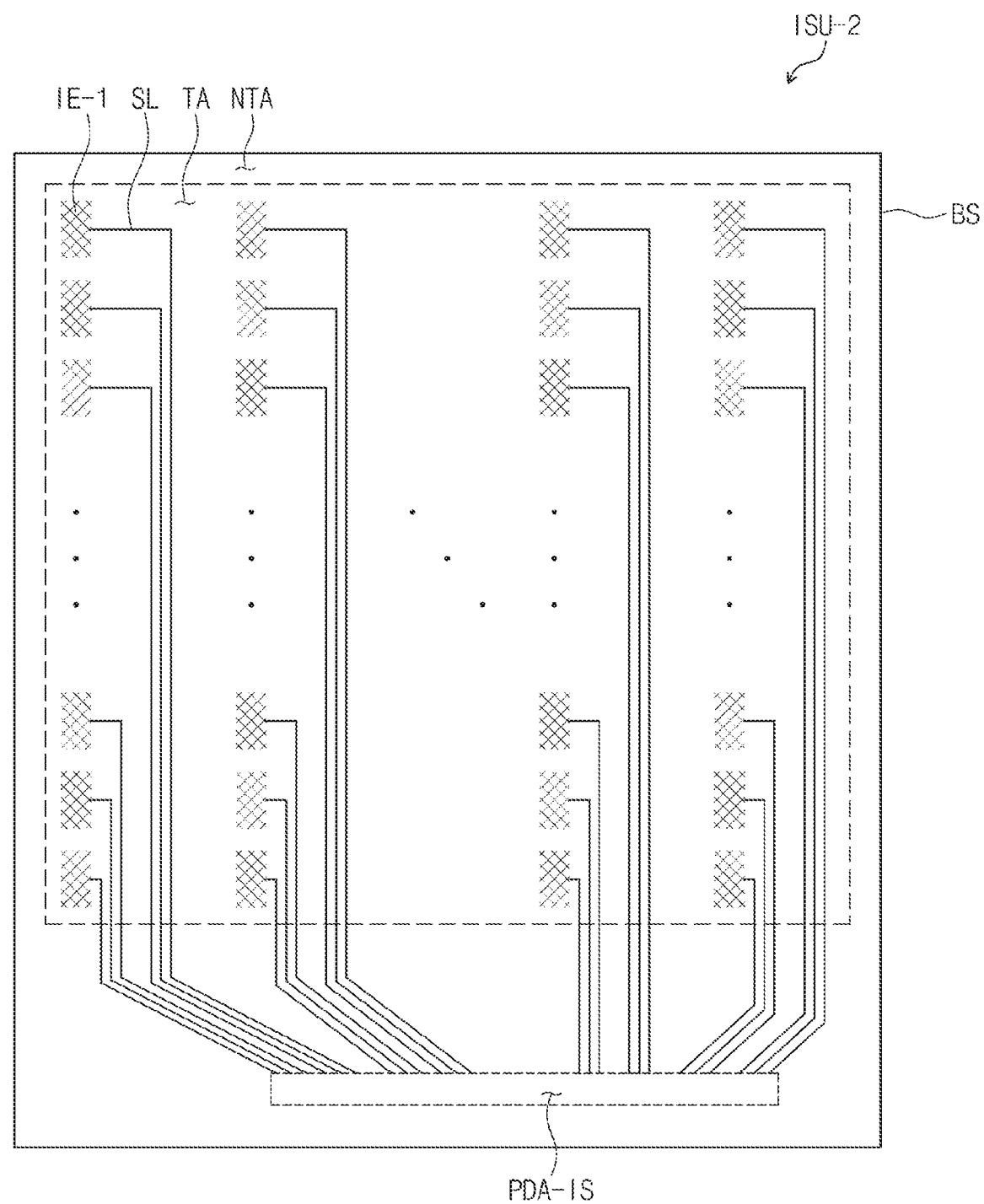
FIGS. 14 and 15 are plan views of exemplary embodiments of input sensing units according to the principles of the invention.
Figure 15:
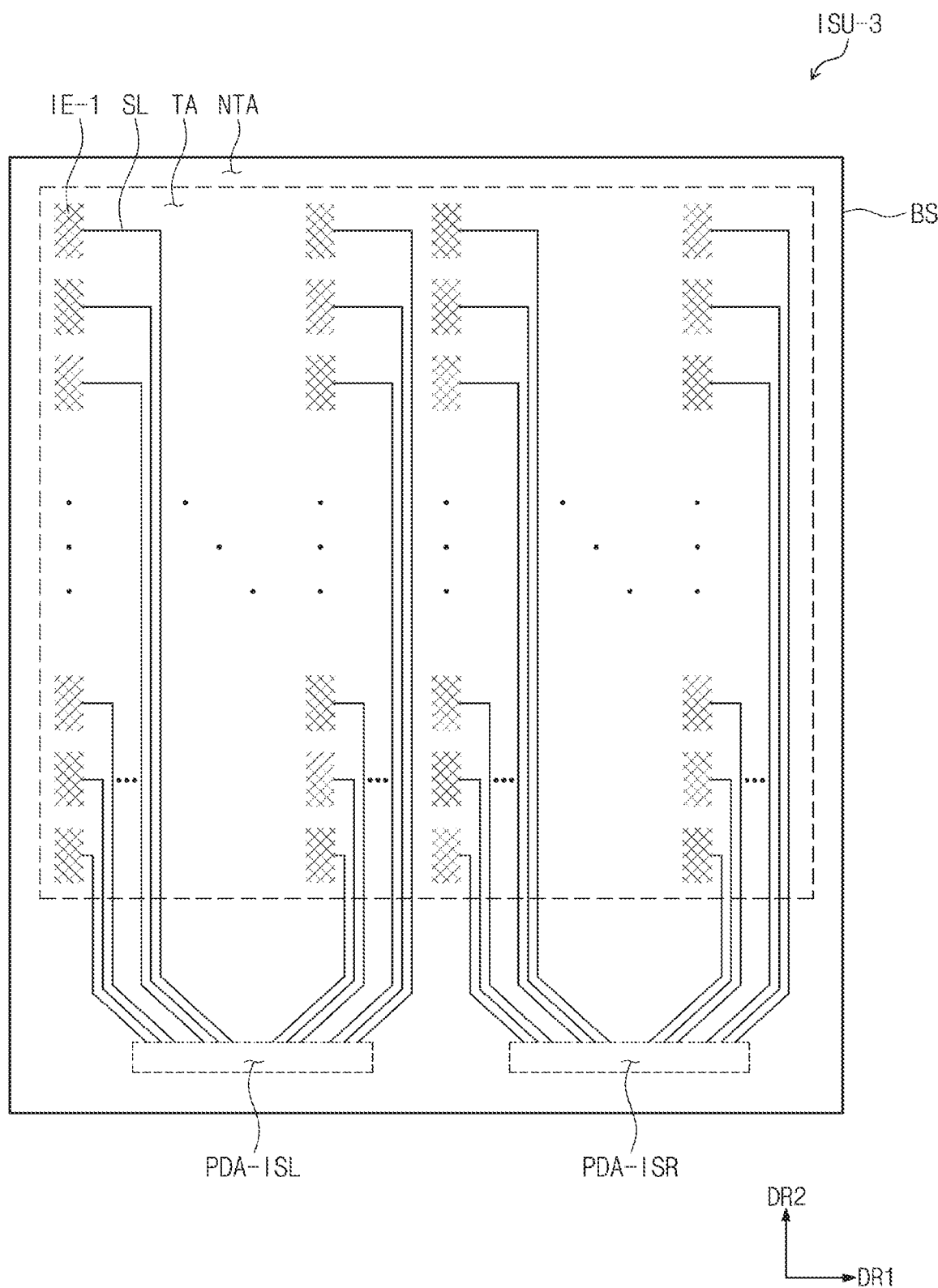

FIGS. 14 and 15 are plan views of exemplary embodiments of input sensing units ISU-2 and ISU-3 according to the principles of the invention.

Shapes of sensing electrodes IE-1 of an input sensing unit ISU-2 in FIG. 14 may be different from those of the sensing electrodes IE of the input sensing unit ISU in FIG. 6. Shapes of sensing electrodes IE-1 of an input sensing unit ISU-3 in FIG. 15 may be different from those of the sensing electrodes IE of the input sensing unit ISU-1 in FIG. 10.

The sensing electrodes IE-1 of FIGS. 14 and 15 may have mesh shapes.

Other components of the input sensing units ISU-2 and ISU-3 of FIGS. 14 and 15 may be substantially the same as corresponding components of the input sensing units ISU and ISU-1 of FIGS. 6 and 10, and thus the descriptions thereof are omitted to avoid redundancy.

Figure 16:
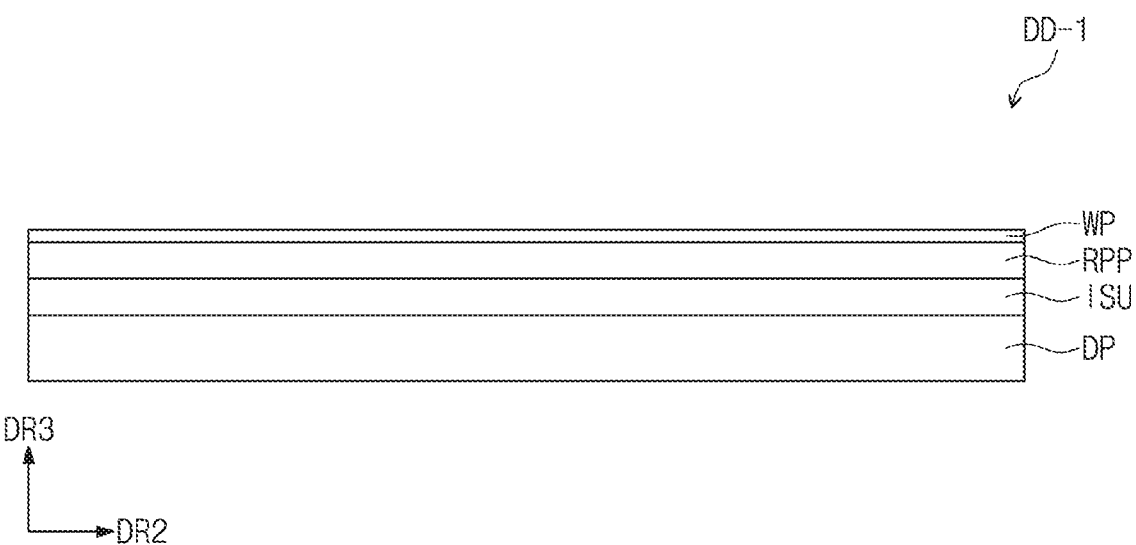
FIGS. 16 and 17 are cross-sectional views of exemplary embodiments of display devices according to the principles of the invention.
Figure 17:
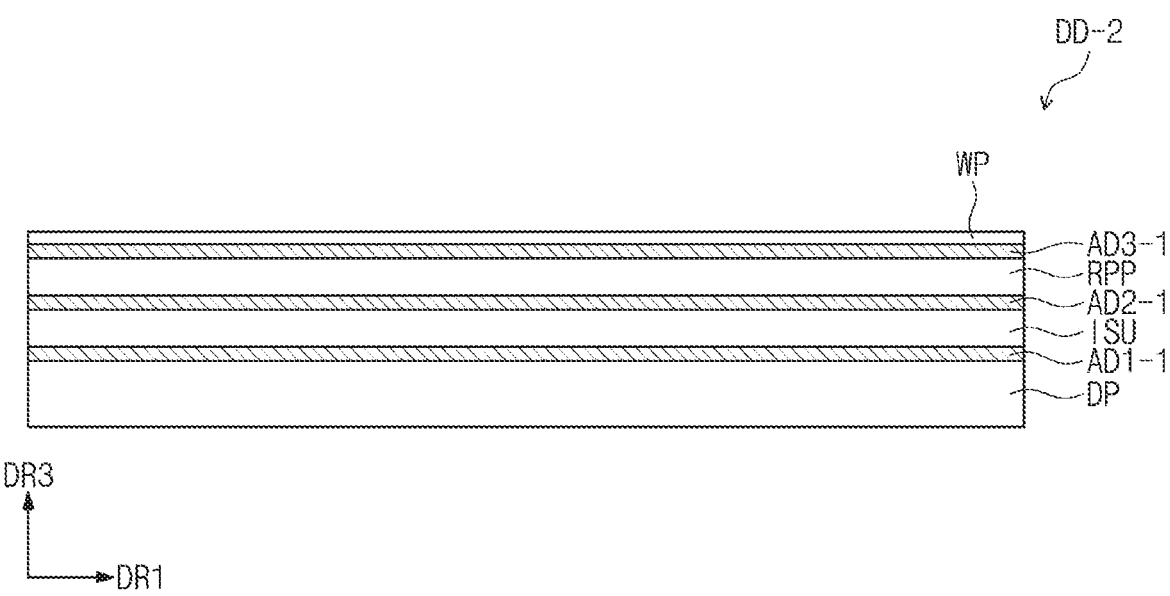

FIGS. 16 and 17 are cross-sectional views of exemplary embodiments of display devices DD-1 and DD-2 according to the principles of the invention.

Referring to FIG. 16, a display device DD-1 may include a display panel DP, an input sensing unit ISU, an anti-reflection member RPP, and a window WP. The input sensing unit ISU may be formed on a base surface provided from the display panel by continuous processes. The stacking order of the input sensing unit ISU and the anti-reflection member RPP may be changed. The anti-reflection member RPP may be formed on the input sensing unit ISU by continuous processes or may be adhered to the input sensing unit ISU by an adhesive member.

In an embodiment of the invention, the display device DD-1 may not include the separate anti-reflection member RPP. In an embodiment of the invention, the input sensing unit ISU of the display device DD-1 may further have an anti-reflection function. In an embodiment of the invention, the display panel DP may further have an anti-reflection function.

Referring to FIG. 17, a display device DD-2 may include a display panel DP, an input sensing unit ISU, an anti-reflection member RPP, a window WP, and adhesive members AD1-1, AD2-1 and AD3-1.

The anti-reflection member RPP included in the display device DD-2 may be disposed over the input sensing unit ISU, unlike the anti-reflection members RPP illustrated in FIGS. 2A and 2B.

Figure 18:
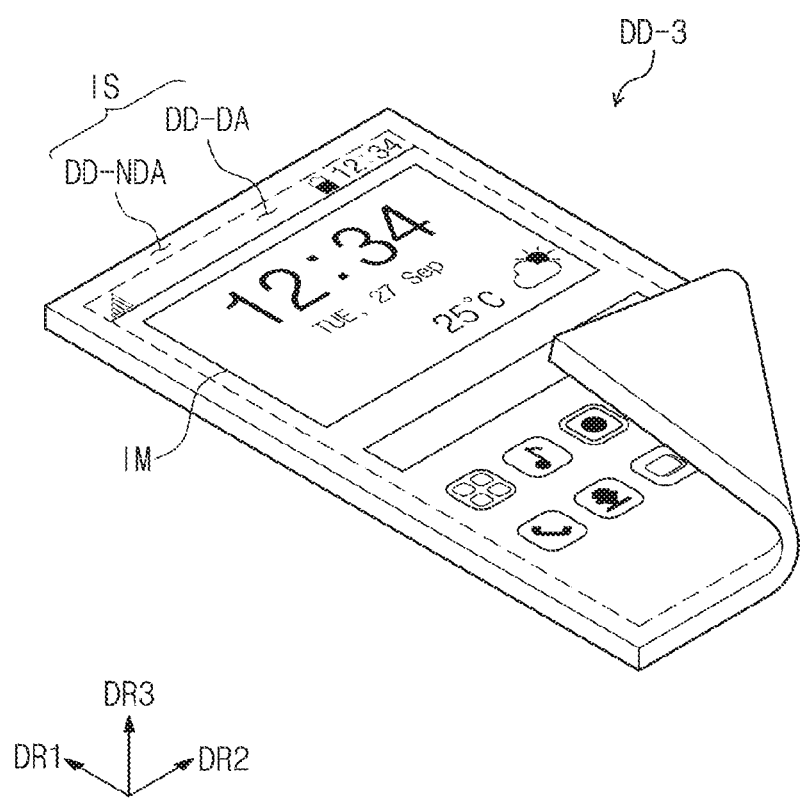
FIG. 18 is a perspective view of an exemplary embodiment of a display device constructed according to the principles of the invention in a compact, folded position.

FIG. 18 is a perspective view of an exemplary embodiment of a display device constructed according to the principles of the invention in a compact, folded position.

A portion or an entire portion of a display device DD-3 may be bendable or rollable. In other words, the display device DD-3 according to an embodiment of the invention may be a flexible display device.

According to an embodiment of the invention, it is possible to provide the display device including the input sensing unit having a pad connection part with a reduced dimension along its length. Thus, the portion of the pad connection part of the input sensing unit and the pad connection part of the display panel that overlaps each other may be minimized to improve the stability of the processes of manufacturing the display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel having a single display area including a plurality of light emitting elements and a single non-display area having a plurality of display pads electrically connected to the plurality of light emitting elements;
    a first printed circuit board disposed on the single non-display area of the display panel and electrically connected to the plurality of display pads;
    a first adhesive member disposed on the single display area of the display panel and a portion of the first printed circuit board;
    an anti-reflection member overlapping with the single display area and disposed on the first adhesive member;
    a second adhesive member disposed on the anti-reflection member;
    a second printed circuit board overlapping with the single non-display area;
    an anisotropic conductive film disposed on the second printed circuit board;
    a plurality of sensing electrodes overlapping with the single display area and disposed on the second adhesive member;
    a plurality of signal lines, each of which is connected to a corresponding one of the plurality of sensing electrodes; and
    a plurality of sensing pads disposed on the anisotropic conductive film and electrically connected to the second printed circuit board by the anisotropic conductive film, wherein the sensing pads are arranged in a plurality of rows in a plan view and overlap with the single non-display area;
    a base film disposed on the plurality of sensing electrodes, the plurality of signal lines, and the plurality of sensing pads;
    a third adhesive member disposed on the base film; and
    a window disposed on the third adhesive member.

2. The display device of claim 1, wherein each of the plurality of sensing electrodes is insulated from others of the plurality of sensing electrodes.

3. The display device of claim 2, wherein the sensing electrodes are arranged in a matrix form.

4. The display device of claim 2, wherein the plurality of sensing pads comprises:
    a plurality of first sensing pads arranged in a first row of the plurality of rows;
    a plurality of second sensing pads arranged in a second row of the plurality of rows; and
    a plurality of third sensing pads arranged in a third row of the plurality of rows.

5. The display device of claim 4, wherein n signal lines of the plurality of signal lines are disposed between adjacent two of the plurality of first sensing pads, where 'n' is a natural number equal to or greater than 2, and
    wherein m signal line(s) of the plurality of signal lines is/are disposed between adjacent two of the plurality of second sensing pads, where 'm' is a natural number less than the 'n'.

6. The display device of claim 5, wherein the 'n' is 2 and the 'm' is 1.

7. The display device of claim 6, wherein no signal lines are disposed between any adjacent two of the plurality of third sensing pads.

8. The display device of claim 4, wherein the first sensing pads are arranged in a first direction, the second sensing pads are arranged in the first direction, and the third sensing pads are arranged in the first direction,
    wherein the plurality of first sensing pads comprises:
    a plurality of first left sensing pads overlapping with the second sensing pads and the third sensing pads in a second direction perpendicular to the first direction;

a plurality of first central sensing pads overlapping with only the second sensing pads of the plurality of sensing pads in the second direction; and a plurality of first right sensing pads not overlapping with the plurality of second sensing pads and the plurality of third sensing pads in the second direction.

9. The display device of claim 8, wherein the plurality of second sensing pads comprises:
a plurality of second left sensing pads overlapping with only the third sensing pads of the plurality of sensing pads in the second direction;
a plurality of second central sensing pads overlapping with the first sensing pads and the third sensing pads in the second direction; and
a plurality of second right sensing pads overlapping with only the first sensing pads of the plurality of sensing pads in the second direction.

10. The display device of claim 9, wherein the plurality of third sensing pads comprises:
a plurality of third left sensing pads not overlapping with the plurality of first sensing pads and the plurality of second sensing pads in the second direction;
a plurality of third central sensing pads overlapping with only the second sensing pads of the plurality of sensing pads in the second direction; and
a plurality of third right sensing pads overlapping with the first sensing pads and the second sensing pads in the second direction.

11. The display device of claim 4, wherein some of the sensing pads are arranged in two overlapping rows, and other of the sensing pads are arranged in three overlapping rows,
wherein two of the plurality of signal lines are disposed between and adjacent two of the plurality of first sensing pads,
wherein two of the plurality of signal lines are disposed between two of the plurality of second sensing pads, which are adjacent to each other in the two overlapping rows, and
wherein one of the plurality of signal lines is disposed between two of the plurality of second sensing pads, which are adjacent to each other in the three overlapping rows.

12. The display device of claim 11, wherein a distance between the third sensing pads adjacent to each other in the two overlapping rows is different from a distance between the third sensing pads adjacent to each other in the three overlapping rows.

13. The display device of claim 4, wherein a first distance between the first sensing pads is greater than a second distance between the second sensing pads, and the second distance between the second sensing pads is greater than a third distance between the third sensing pads.

14. The display device of claim 1, wherein the plurality of sensing pads is disposed in a sensing pad area having a first length that is shorter than a second length of a display pad area in which the plurality of display pads is disposed.

15. The display device of claim 14, wherein the first length is equal to or greater than 35% and less than 45% of a third length of the display panel, and
wherein the second length is equal to or greater than 45% and less than 55% of the third length.

16. The display device of claim 14, wherein the first length is equal to or greater than 75% and equal to or less than 85% of the second length.

17. The display device of claim 1, further comprising a left sensing pad area in which left sensing pads of the plurality of sensing pads are disposed, and a right sensing pad area in which right sensing pads of the plurality of sensing pads are disposed;
a display pad area in which the plurality of display pads is disposed; and
wherein a right portion of the left sensing pad area overlaps with a left portion of the display pad area in a plan view, and a left portion of the right sensing pad area overlaps with a right portion of the display pad area in a plan view.

18. The display device of claim 1, wherein the plurality of sensing pads does not overlap with the plurality of display pads when viewed in a plan view.

19. The display device of claim 1, wherein a portion of the plurality of sensing pads overlaps with the anti-reflection member when viewed in a plan view.

20. The display device of claim 1, wherein each of the plurality of sensing electrodes has a mesh shape.

21. The display device of claim 1, wherein the plurality of sensing electrodes includes a transparent conductive material.

22. The display device of claim 19, wherein the anti-reflection member is a polarizer.

23. The display device of claim 1, wherein a length of one row of the plurality of rows is different from a length of another row of the plurality of rows.

24. A display device comprising:
a display panel having a single display area including a plurality of light emitting elements and a single non-display area having a plurality of display pads electrically connected to the plurality of light emitting elements;
an input sensing unit disposed on the display panel and sensing a contact of an external object,
wherein the input sensing unit comprises:
a base film;
a plurality of sensing electrodes disposed under the base film and overlapping with the single display area;
a plurality of signal lines respectively connected to the plurality of sensing electrodes and transmitting signals corresponding to changes in capacitance of the plurality of sensing electrodes; and
a plurality of sensing pads respectively connected to the plurality of signal lines and arranged in a non-linear configuration, wherein the sensing pads overlap with the single non-display area.

25. The display device of claim 24, further comprising:
an anti-reflection member disposed between the display panel and the input sensing unit.

26. The display device of claim 25, wherein the anti-reflection member is a polarizer.

27. The display device of claim 25, further comprising:
a first adhesive member disposed between the display panel and the anti-reflection member; and
a second adhesive member disposed between the input sensing unit and the anti-reflection member.

28. The display device of claim 24, wherein at least one of the plurality of sensing electrodes is capacitively coupled to the external object to generate the changes in capacitance.

29. The display device of claim 24, wherein each of the plurality of sensing electrodes is insulated from others of the plurality of sensing electrodes.

30. The display device of claim 24, wherein the plurality of sensing pads comprises:
a plurality of first sensing pads arranged in a first row of a plurality of rows;

a plurality of second sensing pads arranged in a second row of the plurality of rows; and a plurality of third sensing pads arranged in a third row of the plurality of rows.

31. The display device of claim 30, wherein n signal lines of the plurality of signal lines are disposed between adjacent two of the plurality of first sensing pads, where 'n' is a natural number equal to or greater than 2, and wherein m signal line(s) of the plurality of signal lines is/are disposed between adjacent two of the plurality of second sensing pads, where 'm' is a natural number less than the 'n'.

32. The display device of claim 31, wherein the 'n' is 2 and the 'm' is 1.

33. The display device of claim 32, wherein no signal lines are disposed between any adjacent two of the plurality of third sensing pads.

34. The display device of claim 30, wherein the first sensing pads are arranged in a first direction, the second sensing pads are arranged in the first direction, and the third sensing pads are arranged in the first direction, wherein the plurality of first sensing pads comprises:

a plurality of first left sensing pads overlapping with the second sensing pads and the third sensing pads in a second direction perpendicular to the first direction;

a plurality of first central sensing pads overlapping with only the second sensing pads of the plurality of sensing pads in the second direction; and a plurality of first right sensing pads not overlapping with the plurality of second sensing pads and the plurality of third sensing pads in the second direction.

35. The display device of claim 34, wherein the plurality of second sensing pads comprises:

a plurality of second left sensing pads overlapping with only the third sensing pads of the plurality of sensing pads in the second direction;

a plurality of second central sensing pads overlapping with the first sensing pads and the third sensing pads in the second direction; and a plurality of second right sensing pads overlapping with only the first sensing pads of the plurality of sensing pads in the second direction.

36. The display device of claim 35, wherein the plurality of third sensing pads comprises:

a plurality of third left sensing pads not overlapping with the plurality of first sensing pads and the plurality of second sensing pads in the second direction;

a plurality of third central sensing pads overlapping with only the second sensing pads of the plurality of sensing pads in the second direction; and a plurality of third right sensing pads overlapping with the first sensing pads and the second sensing pads in the second direction.

37. The display device of claim 24, wherein the plurality of sensing pads is disposed in a sensing pad area having a first length that is shorter than a second length of a display pad area in which the plurality of display pads is disposed.

38. The display device of claim 37, wherein the first length is equal to or greater than 35% and less than 45% of a third length of the display panel, and wherein the second length is equal to or greater than 45% and less than 55% of the third length.

39. The display device of claim 37, wherein the first length ranges from 75% to 85% of the second length.

40. The display device of claim 24, wherein the sensing pads are arranged in a plurality of rows, a length of one row of the plurality of rows is different from a length of another row of the plurality of rows.

* * * * *